United States Patent
Russ et al.

(10) Patent No.: US 6,898,062 B2
(45) Date of Patent: May 24, 2005

(54) ELECTROSTATIC DISCHARGE (ESD) PROTECTION DEVICE WITH SIMULTANEOUS AND DISTRIBUTED SELF-BIASING FOR MULTI-FINGER TURN-ON

(75) Inventors: Cornelius Christian Russ, Princeton, NJ (US); John Armer, Middlesex, NJ (US); Markus Paul Josef Mergens, Plainsboro, NJ (US); Phillip Czeslaw Jozwiak, Plainsboro, NJ (US)

(73) Assignee: Sarnoff Corporation, Princeton, NJ (US)

( * ) Notice: Subject to any disclaimer, the term of this patent is extended or adjusted under 35 U.S.C. 154(b) by 0 days.

(21) Appl. No.: 10/822,912

(22) Filed: Apr. 12, 2004

(65) Prior Publication Data

US 2004/0188776 A1 Sep. 30, 2004

Related U.S. Application Data

(62) Division of application No. 10/159,801, filed on May 31, 2002, now abandoned.
(60) Provisional application No. 60/303,256, filed on Jul. 5, 2001.

(51) Int. Cl.[7] .................................................. H02H 9/00
(52) U.S. Cl. .......................... 361/56; 361/58; 361/91.1; 361/111; 361/118
(58) Field of Search ............................. 361/18, 58, 56, 361/54, 111, 113, 115, 118, 127, 91.1

(56) References Cited

U.S. PATENT DOCUMENTS

| | | | |
|---|---|---|---|
| 5,468,667 A | 11/1995 | Diaz et al. ..................... 437/50 |
| 5,493,133 A | 2/1996 | Duvvury et al. ............ 257/111 |
| 5,510,728 A | 4/1996 | Huang .......................... 326/30 |
| 5,623,387 A | 4/1997 | Li et al. ........................ 361/56 |
| 5,686,751 A | 11/1997 | Wu .............................. 257/356 |
| 5,701,024 A | 12/1997 | Watt ............................ 257/360 |
| 5,780,897 A | 7/1998 | Krakauer ..................... 357/368 |
| 5,789,791 A | 8/1998 | Bergemont .................. 257/401 |
| 5,831,316 A | 11/1998 | Yu et al. ...................... 257/401 |
| 5,874,763 A | 2/1999 | Ham .......................... 257/360 |
| 5,874,764 A | 2/1999 | Hsieh et al. ................ 257/401 |
| 5,903,032 A | 5/1999 | Duvvury ..................... 257/356 |
| 5,959,488 A | 9/1999 | Lin et al. .................... 327/313 |
| 5,982,217 A | 11/1999 | Chen et al. ................. 327/321 |
| 5,986,867 A | 11/1999 | Duvvury et al. ............ 361/111 |
| 6,002,156 A | 12/1999 | Lin ............................. 257/356 |
| 6,028,758 A | 2/2000 | Sharpe-Geilser ............ 361/111 |
| 6,064,249 A | 5/2000 | Duvvury et al. ............ 327/314 |
| 6,097,066 A | 8/2000 | Lee et al. ................... 257/355 |
| 6,147,538 A | 11/2000 | Andresen et al. ........... 327/309 |
| 6,249,413 B1 | 6/2001 | Duvvury ..................... 361/111 |
| 6,288,884 B1 | 9/2001 | Yu .............................. 361/111 |
| 6,310,379 B1 | 10/2001 | Andresen et al. ........... 257/355 |
| 6,320,230 B1 | 11/2001 | Yu .............................. 257/355 |
| 6,462,384 B2 * | 10/2002 | Kwon ......................... 257/360 |
| 6,621,126 B2 * | 9/2003 | Russ ........................... 257/355 |
| 6,628,493 B1 | 9/2003 | Chen et al. ................. 361/111 |
| 6,661,273 B1 | 12/2003 | Lai et al. .................... 327/310 |

* cited by examiner

Primary Examiner—Stephen W. Jackson
(74) Attorney, Agent, or Firm—William J. Burke

(57) ABSTRACT

An ESD protection circuit for a semiconductor integrated circuit (IC) having protected circuitry, includes an SCR having at least one finger. Each finger includes a PNP transistor and an NPN transistor, where an emitter of the PNP and NPN transistors is respectively coupled between an I/O pad of the IC and ground, a base of the PNP transistor being coupled to a collector of the NPN transistor, and a base of the NPN transistor being coupled to a collector of the PNP transistor. The NPN transistor of each finger further includes a first gate for triggering said finger. A PMOS transistor includes a source and a drain respectively coupled to the I/O pad of the IC and the first gate of the NPN transistor. Further, a gate of the PMOS transistor is coupled to a supply voltage of the IC.

35 Claims, 13 Drawing Sheets

ELECTROSTATIC DISCHARGE (ESD) PROTECTION DEVICE WITH SIMULTANEOUS AND DISTRIBUTED SELF-BIASING FOR MULTI-FINGER TURN-ON

CROSS REFERENCES

This patent application is a divisional of U.S. patent application Ser. No. 10/159,801 filed May 31, 2002 now abandoned and claims the benefit of U.S. Provisional Application Ser. No. 60/303,256, filed Jul. 5, 2001, the contents of which are incorporated by reference herein.

FIELD OF THE INVENTION

This invention generally relates to the field of electrostatic discharge (ESD) protection circuitry, and more specifically, improvements for multi-fingered MOS protection circuitry of an integrated circuit (IC).

BACKGROUND OF THE INVENTION

Robust NMOS and other ESD protection are crucial to obtain high levels of ESD robustness in CMOS technologies. In processes with the option of local blocking of silicide, ballasting resistance is introduced to ensure equal current spreading and uniform multi-finger triggering.

In order to achieve adequate ESD protection levels with high failure thresholds and good clamping capabilities, sufficient device width must be provided. Therefore, multi-finger MOS structures have been implemented for ESD protection. Furthermore, advanced CMOS technologies require high numbers of fingers, since decreasing pad pitch and minimum active area width might be largely restricted by design limitations.

A major concern with regard to multi-finger devices under ESD stress is the possibility of non-uniform triggering of the fingers. In order to ensure uniform turn-on of multi-finger structures, the voltage value at the second finger breakdown $V_{t2}$ must exceed the triggering voltage $V_{t1}$ of the parasitic BJT transistor, i.e. the voltage at the onset of snapback. In order to avoid damaging an initially triggered finger from a high current load, the adjacent fingers must also be switched on into the low resistive ESD conduction state (i.e. snapback). To achieve a homogeneity condition $V_{t1} < V_{t2}$, either the initial triggering voltage $V_{t1}$ must be reduced or the second breakdown voltage $V_{t2}$ must be increased.

Complications arise, for example, in standard I/O library cells, where the multi-finger MOS device is formed as a split device. In particular, the multi-finger device is formed as a split device where a first portion of the fingers is actively used by circuitry of an integrated circuit (IC) for functional purposes (i.e., the driver), and a second portion of the fingers is utilized only for ESD protection (i.e., the dummy ESD fingers). The multi-finger device can be configured for several drive strengths by including or excluding a particular number of fingers from being driven at their respective gates by a pre-driver. That is, during normal circuit operation the active fingers are controlled by the pre-driver, while the non-active dummy ESD fingers are not utilized. In this latter instance, the gates of the unused driver fingers are typically grounded, either directly or indirectly, through a resistance.

During an ESD event, trigger competition between the actively used (driver fingers) and unused fingers (dummy ESD fingers) may cause non-uniform turn-on of the normally active and non-active fingers. Specifically, the driver fingers may trigger prior to the dummy ESD fingers (i.e., non-uniform turn-on of all the fingers), which may result in failure of the MOS device and damage of the IC. As such, only a part of the total device carries ESD current, while the remainder of the device does not contribute to the current flow and remains unused.

Further problems arise for drivers or other I/O circuitry, which are configured to be over-voltage tolerant (OVT). That is, the voltage that is applied to the I/O circuitry may be higher than the supply voltage (e.g. VDD). In many over-voltage cases, a single NMOS driver may be susceptible to hot carrier injection because the applied voltage exceeds the normally specified maximum voltage between drain and gate. One method to overcome hot carrier injection concerns is to use a cascoded output driver. That is, two NMOS devices (transistors) are connected in series between an I/O pad of the IC and ground. The serially connected cascoded NMOS transistors form the output driver. The gates of the active cascoded NMOS transistor fingers, whose source is coupled to ground, are driven by the pre-driver. Alternately, the gates of the non-active (dummy ESD fingers) cascoded NMOS transistor fingers are tied to ground. Furthermore, the gates of the active and non-active NMOS transistor fingers are tied to a supply line (e.g., VDD) in a normally turned on condition, while drains are coupled to the I/O pad. In this manner, neither of the cascoded NMOS transistor's drain-gate potential can increase enough to cause a hot-carrier concern.

However, during an ESD event, the cascoded devices are difficult to trigger due to the longer base length of the parasitic NPN transistor. As such, the $V_{t1}$ value increases, while the $V_{t2}$ value remains substantially constant, thereby causing additional non-uniform triggering problems of the cascoded NMOS driver. Again, the issue of trigger competition may cause only a part of the transistor fingers to trigger, thereby causing premature failure. As such, there is a need in the art to provide an ESD protection device with simultaneous and distributed self-biasing for multi-finger turn-on.

SUMMARY OF THE INVENTION

The disadvantages heretofore associated with the prior art are overcome by various embodiments of an electrostatic discharge (ESD) protection circuit in a semiconductor integrated circuit (IC) having protected circuitry. The ESD protection circuit has a simultaneous and distributed self-biased multi-finger turn-on MOS device. In one embodiment, each finger of a plurality of fingers comprise a P-well, a plurality of N+ drain regions interspersed in the P-well, where the N+ drain regions are coupled to a high potential.

Each finger of the plurality of fingers also include a plurality of N+ source regions interspersed in the P-well and substantially parallel with the plurality of interspersed N+ drain regions, where the N+ source regions are coupled to ground. A gate region is disposed between the plurality of interspersed N+ drain regions and the plurality of interspersed N+ source regions and over the P-well region.

Additionally, a first plurality of P+ local substrate tie regions are interspersed between and electrically isolated from the plurality of interspersed N+ drain regions, and a second plurality of P+ local substrate tie regions are interspersed between and electrically isolated from the plurality of interspersed N+ source regions. Furthermore, at least one of the first and/or second plurality of P+ substrate tie regions of at least two fingers are electrically connected, and the gate region of each finger is coupled to any one element comprising a pre-driver circuit, ground, and the first and second plurality of P+ local substrate tie regions.

In a second embodiment, an ESD protection circuit includes a simultaneously biased multi-finger turn-on MOS device for a semiconductor integrated circuit (IC) having protected circuitry. The ESD protection circuit includes a multi-fingered NMOS transistor, where each finger has a drain and source for respectively coupling between an I/O pad of the IC and ground, as well as a gate for biasing the finger.

Additionally, an ESD detector includes a PMOS transistor having a source coupled to the I/O pad of the IC, as well as a gate for coupling to a supply voltage of the IC. A parasitic capacitance is formed between the supply line of the IC and ground. A transfer circuit having a first diode is coupled between the drain of the PMOS transistor and the gate of each finger of the NMOS transistor.

BRIEF DESCRIPTION OF THE DRAWINGS

To facilitate understanding, identical reference numerals have been used where possible, to designate identical elements that are common to the figures.

DETAILED DESCRIPTION OF THE INVENTION

The present invention is described with reference to CMOS devices. However, those of ordinary skill in the art will appreciate that selecting different dopant types and adjusting concentrations allows the invention to be applied to other devices that are susceptible to damage caused by ESD. The present invention includes various illustrative embodiments utilizing a multi-fingered NMOS device, which may provide dual functions as a driver during normal operation (powered state) of the IC, and as an ESD protection device when the IC is in a non-powered state.

Figure 1:
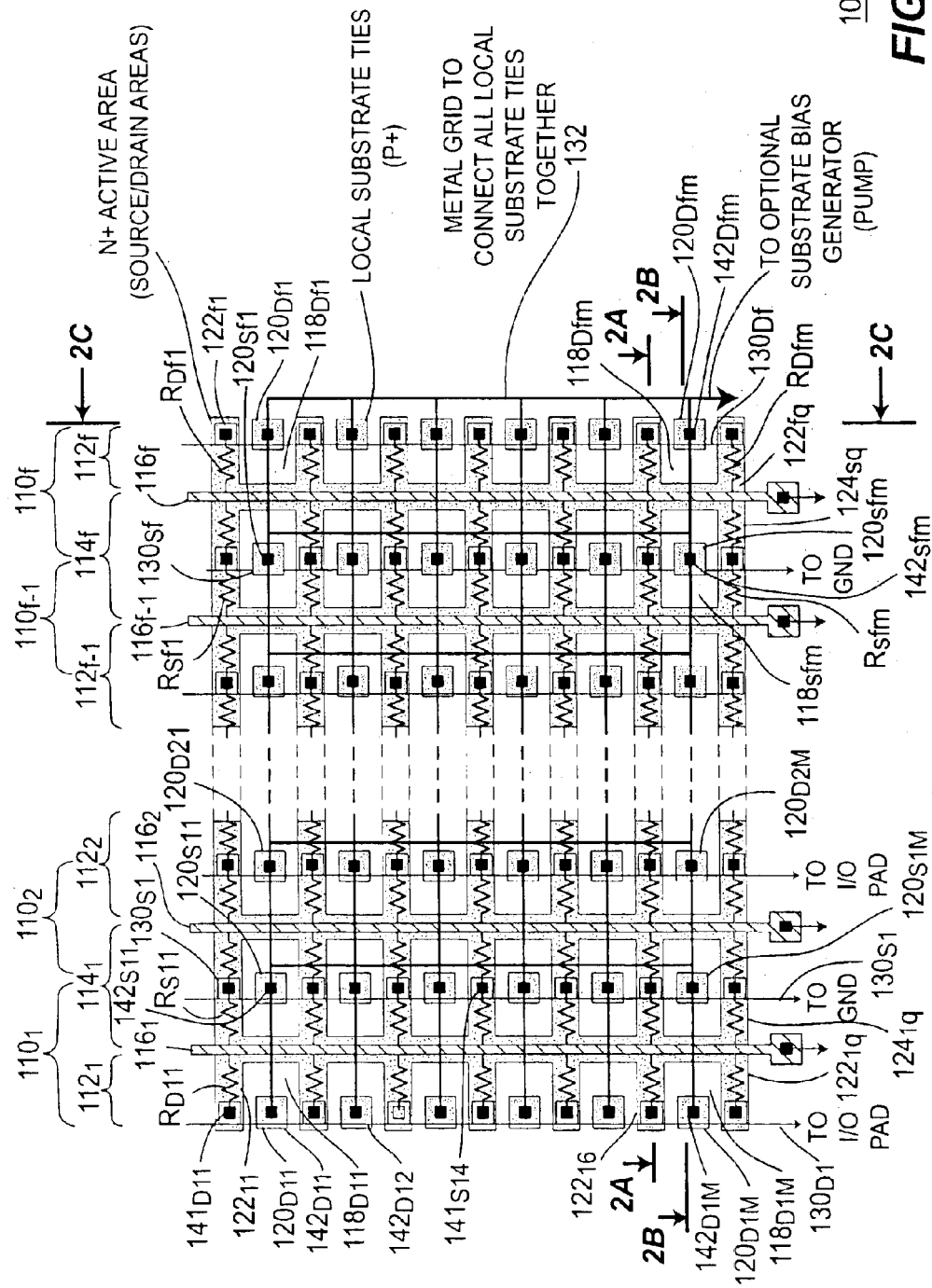
FIG. 1 depicts a top view layout of a multi-finger turn-on NMOS ESD/driver device of the present invention.
Figure 2:
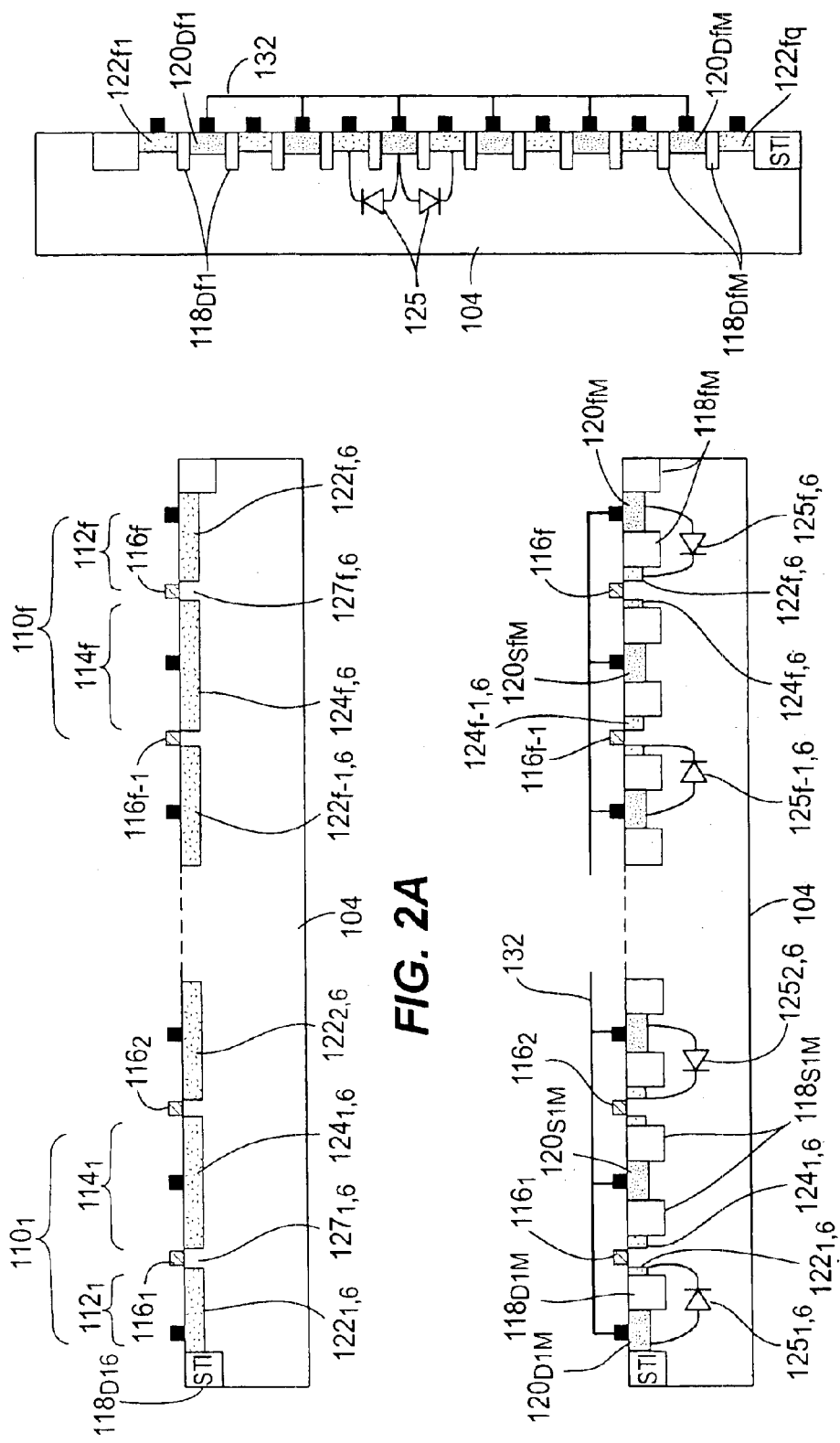
FIGS. 2A–2C depict cross-sectional view layouts of the NMOS ESD/driver device, along respective lines a–a', b–b', and c–c' of FIG. 1.

FIG. 1 depicts a top view layout of a multi-finger turn-on NMOS ESD/driver device 100 of the present invention. FIGS. 2A–2C depict cross-sectional view layouts of the NMOS ESD/driver device of FIG. 1, along respective lines a–a', b–b', and c–c', and should be viewed along with FIG. 1. The illustrative embodiment in FIGS. 1 and 2A through 2C provide a layout for providing simultaneous triggering of the multiple fingers of the NMOS ESD/driver device. The illustrative layout advantageously affords greater circuit design versatility. For example, the fingers of the NMOS device may be split into a first group of fingers actively used during normal IC operation, and a second group of fingers, which are passive and used as passive (dummy) fingers during non-powered IC conditions for ESD events. Both, the active fingers and the passive fingers are required together to achieve a total device size that is sufficient to safely shunt a certain amount of ESD current to ground.

The layout also provides for nearly simultaneous turn-on of all the fingers (i.e., both active and passive finger groups) by various alternate techniques including (optional) external gate biasing of the fingers, or external substrate biasing or self-biasing of the substrate (i.e., P-substrate) formed under the well and doped regions of the fingers. The NMOS device 100 is fully driver compatible, meaning that the active driver fingers also contribute during ESD protection during non-powered IC conditions, while acting as active transistor and not interfering with normal circuit operation during powered-on IC conditions. These advantages are discussed in greater detail with regard to the layout views of FIGS. 1 and 2A–2C, as well as in the context of the multi-finger NMOS device used in various circuits, as shown and discussed with regards to FIGS. 3–13.

Referring to FIG. 1, a plurality of fingers $110_1$ through $110_f$ is formed substantially parallel in a P-well 104 (see FIGS. 2A–2C). Each finger 110 comprises a drain finger region 112, a source finger region 114, and a gate finger region 116. FIG. 1 illustratively depicts drain finger regions $112_1$ through $112_f$, source finger regions $114_1$ through $114_f$, and gate finger regions $116_1$ through $116_f$, where the first drain, gate and source regions $112_1$, $114_1$, and $116_1$ form a first finger $110_1$.

Referring to FIG. 2A, the drain and source finger regions 112 and 114 are formed from a highly doped N+ material, which are disposed in the lower doped P-well 104 substantially parallel to each other. The gate finger region 116 (e.g., a polysilicon gate region) is disposed between the drain and source finger regions 112 and 114 over the P-well 104, as well as over a thin gate dielectric layer (i.e., the gate oxide). As such, a portion of the P-well between the source and drain finger regions 112 and 114, and under the gate regions 116, forms a channel region 127 (e.g., channel regions $127_{16}$ and $127_{f6}$ shown in FIG. 2A) of the NMOS transistor.

Each drain finger region 112 further comprises a first plurality of P+ doped regions $120_D$ interspersed in the P-well 104, where each P+ region $120_D$ forms a local substrate tie. For example, drain finger region $112_1$ comprises P+ regions $120_{D11}$ through $120_{D1m}$. Shallow trench isolation (STI) 118 is provided around each substrate tie $120_{Dfm}$, thereby segmenting each drain finger 112 into a plurality of drain segments $122_1$ through $122_q$, which are all coupled together near the gate region 116. In other words, each drain finger region 112 is formed by a plurality of drain segments $122_q$ that are connected together, and where a respective P+ local tie $120_{Dm}$ is disposed between each drain segment $122_q$. For example, drain finger region $112_1$ comprises drain segments $122_{11}$ through $122_{1q}$ having the P+ local substrate tie regions $120_{D11}$ through $120_{D1m}$ interspersed therebetween. For purposes of clarity, it is noted that the subscript "D" and "S" respectively refer to the drain and source regions of the transistor, and the subscript references "f, m, and q" represent integers greater than one.

Likewise, each source finger region 114 further comprises a first plurality of P+ doped regions $120_S$ interspersed in the P-well 104, where each P+ region $120_S$ forms a local substrate tie. For example, source finger region $114_1$ comprises P+ regions $120_{S11}$ through $120_{S1m}$. Shallow trench isolation (STI) 118 is provided around each substrate tie $120_{Sfm}$, thereby segmenting each source finger 114 into a plurality of source segments $124_1$ through $124_q$, which are all coupled together near the gate region 116. In other words, each source finger region 114 is formed by a plurality of source segments $124_q$ that are connected together, and where a respective P+ local substrate tie $120_{Sm}$ is disposed between each source segment $124_q$. For example, source finger region $114_1$ comprises source segments $124_{11}$ through $124_{1q}$ having the P+ local substrate tie regions $120_{S11}$ through $120_{S1m}$ interspersed therebetween.

Accordingly, a plurality of diodes 125 are formed between each N+ drain segment 122 and P+ local substrate tie region 120, as well as between each N+ source segment 124 and P+ local substrate tie region 120. FIG. 2B illustratively depicts diodes $125_{1,6}$, $125_{26}$, $125_{f-1,6}$ and $125_{f,6}$ formed by P+ regions $120_D$ and drain regions 122.

It is noted that each gate finger region 116 is formed between the drain and source finger regions 112 and 114, and parallel to each other. It is further noted that a source and drain finger region 112 and 114 may be shared by two adjacent gate finger regions. For example, the source finger region $114_1$ is shared between adjacent gate finger regions $116_1$ and $116_2$.

Recall, to ensure uniform turn-on of multi-finger structures, the voltage value at the second finger breakdown $V_{t2}$ must exceed the triggering voltage $V_{t1}$ of the parasitic BJT transistor. One common technique to increase the trigger voltage $V_{t2}$ is by adding ballasting resistance, e.g., by increasing of the drain contact to gate spacing and/or the source contact to gate spacing in conjunction with silicide blocking. However, the additional process steps for the local silicide blocking are costly and known for yield losses. An efficient technique of introducing micro-ballasting resistances $R_D$ and/or $R_S$ to each drain region 122 and/or source region 124 of each finger 110 may be accomplished by so-called active area ballasting of the N+ drain 122 and/or source regions 124 and/or by back-end implementation of resistive ballasting elements (from the silicon contacts up). Where the active area ballasting is provided, the ESD current is confined in parallel resistive channels each being fed by a limited number of silicon contacts. The N+ drain and source regions may alternately be fully silicided, thereby avoiding the costly silicide-blocking steps.

Referring to FIG. 1, preferably, micro-ballasting resistors $R_d$ and $R_s$ are provided in both the drain and source segments 122 and 124 of each finger 110. For example, the drain segments $122_{11}$ through $1221q$ of the first drain finger $112_1$ respectively comprise ballasting resistors $R_{D11}$ through $R_{D1q}$. Similarly, the source segments $124_{11}$ through $124_{1q}$ of the first source finger $114_1$ respectively comprise ballasting resistors $R_{s11}$ through $R_{Siq}$. The illustrative technique of providing sufficient ballast resistance helps to fulfill uniform current spreading within one finger. For a detailed description of providing ballasting resistance, the reader is directed to U.S. patent application Ser. No. 09/583,141, filed May 30, 2000, which is incorporated by reference herein, in its entirety. One skilled in the art will recognize that other techniques to enhance ESD robustness of the NMOS devices include silicide blocking or a fully silicided NMOS transistor device.

The drain segments $122_1$ through $122_q$ of each respective drain finger region 112 are coupled via an external metallic connection, such as metallic connection $130_{D1}$ through $130_{Df}$. The metallic connection $130_{D1}$ through $130_{Df}$ are coupled to each drain segment 122 via contacts (e.g., contact $141_{D11}$) affixed to each drain segment 122. Likewise, the source segments $124_1$ through $124_q$ of each respective source finger region 114 are coupled via a metallic connection, such as metallic connection $130_{S1}$ through $130_{Sf}$. The metallic connection $130_{S1}$ through $130_{Sf}$ are coupled to each source segment 122 via contacts (e.g., contact $141_{S11}$) affixed to each source segment 124. In one embodiment, the metallic connections $130_{D1}$ through $130_{Df}$ of the drain regions 112, as well as $130_{S1}$ through $130_{Sf}$ of the source regions 114 are respectively coupled to the I/O pad 20 and to ground 15, as further discussed in the embodiments of FIGS. 3, 6, and 8.

Similarly, the interspersed P+ doped regions forming the local ties $120_{Dfm}$ of the drain finger regions 112 and $120_{Sfm}$ of the source finger regions 114, are coupled via external coupling such as metallic connections 132. In one embodiment, the external metallic connections 132 are coupled to at least two P+ doped regions 120 via contacts 142. In a second embodiment (as shown in FIG. 1), the external metallic connections 132 are coupled to each P+ doped region 120 via contacts 142 (e.g., contacts $142_{D11}$ and $142_{S11}$ affixed to each P+ doped region 120). In this second embodiment, the external metallic connections 132 form a metal grid to connect all the local substrate ties 120 of the drain and source fingers 112 and 114 together. FIGS. 2B and 2C illustratively show the metal grid 132 coupled to each substrate tie 120.

It is noted that the P+ local substrate ties 120 provide a mechanism to enable self-biasing of the entire multi-finger NMOS device 100. That is, the local substrate ties 120, which are connected together by metal grid 132, will distribute the local substrate potential increase resulting from a local drain-to-substrate junction breakdown. The increased substrate potential distributed around the structure will lower the triggering voltage of the other fingers 110 to provide a simultaneous substrate self-biasing, and therefore ensure uniform turn-on of the fingers 110 of the NMOS device 100. Moreover, the substrate ties 120 (via the metal grid 132) may be further coupled to a substrate bias generator, which will bias and simultaneously trigger the fingers 110 of the NMOS device 100.

Where self-biasing via the substrate-ties 120 is utilized, the gates 116 of each finger 110 may be grounded (for dummy ESD fingers) or connected (for a active driver fingers) to a pre-driver (not shown). Alternately, the gates 116 of the dummy ESD fingers may be connected to the grid 132 of local substrate ties 120 for further enhanced reduction in the trigger voltage. The external connections to the drain, source, and gate regions 112, 114, and 116 of each finger 110 are described in further detail below with regard to FIGS. 3, 6, and 8.

The number of fingers in the entire multi-finger NMOS device 100 may typically range from 10 to 30 fingers. In one embodiment, the multiple fingers 110 of the illustrative NMOS device 100 are apportioned (split) into groups of active and dummy fingers. In a second embodiment, the multiple fingers of the NMOS device may all be dedicated as active fingers, while in a third embodiment, the multiple fingers of the NMOS device 100 may all be dedicated as dummy fingers. Apportioning the fingers of the NMOS device 100 is application specific, where the number of active and dummy fingers varies from application to application. That is, the type and use of the IC circuitry dictates the apportionment requirements (active and/or dummy fingers) of the fingers of the NMOS protection device 100. For example, an NMOS device 100 of the present invention may illustratively have twenty fingers 110, where 2 are dedicated as active driver fingers coupled to a pre-driver, and the remaining 18 passive fingers serve as dummy ESD fingers.

It is also noted that the size (i.e., width) of the fingers 110 may also vary within a single NMOS device 100 (e.g., 20–50 micrometers). One skilled in the art will recognize that the number of fingers 110, groupings of fingers as being active and/or passive, and their size are a matter of design specification. That is, the total active finger width depends on the required functional drive strength, while the total device width depends on the required ESD strength.

Figure 3:
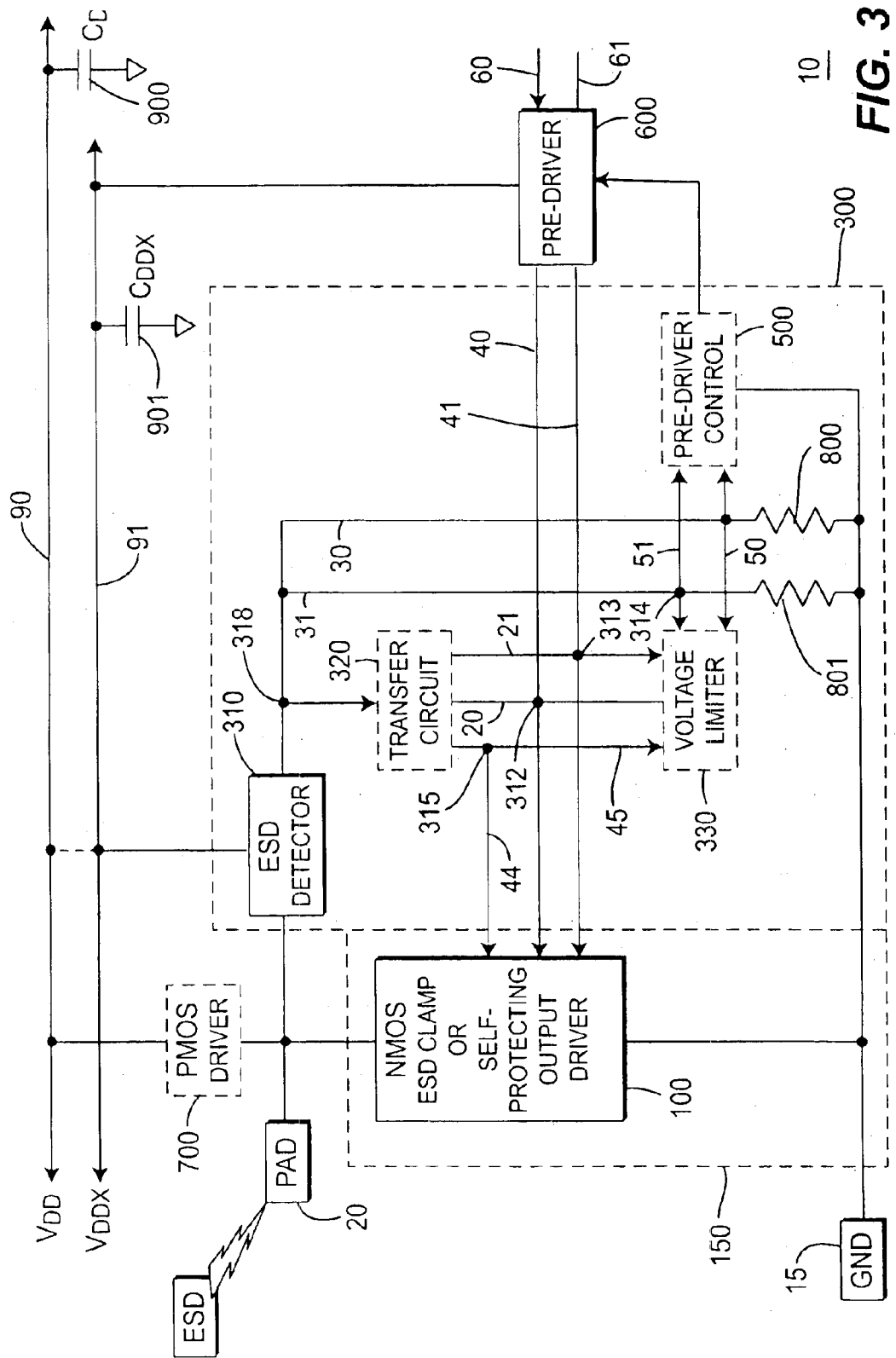
FIG. 3 depicts a schematic block diagram of a portion of an integrated circuit (IC) having a multi-finger NMOS device and ESD protection circuit of the present invention.

FIG. 3 depicts a schematic block diagram of a portion of an integrated circuit (IC) 10 having a multi-finger MOS device 100 and ESD control circuit 300 of the present invention. The present invention utilizes available components of the IC 10 for normal circuit operation, as well as additional ESD protection circuitry 150 during non-powered IC conditions. In particular, components of the IC 10 used during normal operation include an I/O pad 20, a pre-driver 600, at least one supply line (e.g., VDD 90 and VDDx 91, where x is an integer greater than one), and respective parasitic capacitors $C_{DD}$ 900 and $C_{DDx}$ 901. It is noted that parasitic capacitors $C_{DD}$ 900 and $C_{DDx}$ 901 are illustratively formed and coupled respectively between the supply line 90 and ground 15, and supply line 91 and ground 15. The pre-driver 600 and an optional PMOS driver 700 are also considered part of the normal IC operation circuitry.

The ESD protection circuitry includes an ESD-hardened multi-finger NMOS device 100 (with active and/or dummy fingers), and an ESD control circuit 300. The ESD control circuit 300 comprises an ESD detector 310, an optional transfer circuit 320, an optional voltage limiter 330, an optional pre-driver control circuit 500, and optional grounding resistors 800 and 801.

Referring to FIG. 3, the NMOS device 100 is coupled between the pad 20 and ground 15. An optional multi-finger PMOS driver 700 (drawn in phantom) is coupled between the supply line VDD 90 and the pad 10. The ESD detector 310 is coupled to the pad 20 and either voltage supply line VDD 90 or VDDx 91. The ESD detector 310 is further coupled (via line 30) to the ground resistor 800, which is further coupled to ground 15. In an embodiment where a dummy pre-driver (not shown) is utilized for ESD dummy fingers of the NMOS device 100, the ESD detector 310 is further coupled (via line 31) to a second ground resistor 801, which is also coupled to ground 15.

The ground resistors 800 and 801 guarantee that other components (i.e., transfer circuit 320 and voltage limiter 330) remain off during normal circuit operation. Furthermore, during a non-powered IC state and ESD event at the pad 20, the ground resistors 800 and 801 provide the necessary biasing for the voltage limiter 330 and pre-driver control. Additionally, one skilled in the art will recognize that in an embodiment utilizing the optional PMOS driver 700, a corresponding pre-driver (not shown) is coupled to the gates of the multi-finger PMOS device 700 in a similar manner as shown for the pre-driver 600 and the NMOS transistor device 100.

Optionally, the transfer circuit 320 is coupled between the ESD detector 310 and ground 15. The optional transfer circuit 320 is further coupled to the NMOS device 100 via line 40 for the active fingers 153 and via line 41 for the dummy ESD fingers 151. In an embodiment where the NMOS device 100 comprises cascoded transistors (see FIG. 7), the optional transfer circuit 30 is coupled to the upper NMOS transistor of the cascoded transistors via line 44. In an alternate embodiment, the optional voltage limiter 330 may also be provided between the transfer circuit 320 and ground 15. That is, the transfer circuit 320 is coupled to the voltage limiter 330 via lines 20, 21, and 45, thereby limiting the voltage for the respective connections 40, 41, 44 to the NMOS device 100, and the voltage limiter 330 is further coupled to ground 15.

The pre-driver 600 is coupled to the supply voltage VDDx 91 and the gates of the active fingers of the NMOS device 100 via line 40. Where the optional transfer circuit 320 and/or voltage limiter 330 are provided, the pre-driver 600 is also coupled to a node 312 between the transfer circuit 320 and voltage limiter 330. Where a dummy pre-driver (part of the normal pre-driver 600 in FIG. 3) is utilized for the passive fingers of the NMOS device 100, the dummy pre-driver is coupled, via line 41, to node 313 between the transfer circuit 320 and voltage limiter 330. The optional pre-driver control 500 is coupled to the pre-driver 600 and ground 15. If the optional voltage limiter 330 is provided, the pre-driver control 500 is also coupled to the voltage limiter 330 via lines 50 (for normal pre-driver 600) and 51 (for dummy pre-driver 600). Furthermore, the pre-driver 600 has an input line 60 coupled to further functional parts of the circuit (not shown) as required to fulfill its regular functionality. For the dummy pre-driver 600, a similar connection 61 is provided.

The configuration and connectivity between the above-mentioned components of the IC 10 and ESD control device 300 of the present invention (as illustrated by the blocks of FIG. 3) are defined in various embodiments in FIGS. 4–13, and are discussed in further detail below. Circuit analysis is provided for normal circuit operation of the IC 10, and during a non-powered state of the IC 10, when an ESD event occurs at the illustrative pad 20 of the IC 10. The following embodiments of the multi-finger NMOS ESD protection device 100 must protect the circuitry of the IC 10 during an ESD event under non-powered conditions. Moreover, during normal operation of the IC 10 (i.e., the IC is powered on), the multi-finger NMOS device 100 and the ESD control circuitry 150 must not interfere with the operation of the circuitry of the IC 10.

The operation of the circuit shown in FIG. 3 is discussed generally in terms of normal powered-on IC operation and non-powered IC operation during an ESD event. Detailed circuit analysis is shown below with regard to FIGS. 4–13 for each embodiment of the invention.

The ESD detector 310 is used to derive a bias signal and providing a multi-finger turn-on for the entire NMOS device 100. The ESD detector 310 senses the occurrence of an ESD event to the pad 20. Generally, during normal circuit operation, the IC 10 is powered and the parasitic capacitor of the supply lines $C_{DD}$ 900 and $C_{DDx}$ 901 (e.g., approximately 10 pico Farads to 10 nano Farads) are charged such that the supply lines VDD 90 and VDDX 91 remain at the supply line potential, which is above ground 15. As such, the ESD detector 310 is pulled to a high state for normal circuit operation and in one embodiment, the ESD detector 310 is turned off. When the ESD detector 310 is in a high state and is turned off, the pad 20 is decoupled from the transfer circuit 320. Moreover, the transfer circuit 320 decouples the pre-driver 600 from the ESD detector 310. Accordingly, the ESD protection circuit 150 and the active, as well as the dummy ESD fingers of the NMOS device 100 will not interfere with the normal operation of the IC 10. Furthermore, large active circuitry (not shown in FIG. 3) is typically connected between the supply lines VDD 90 and VDDX 91 and ground 15, and in parallel to the parasitic capacitors 900 and 901.

During an ESD event when the IC 10 is not powered on, the parasitic capacitors $C_{DD}$ 900 and $C_{DDx}$ 901 are not charged, which couples supply lines VDD 90 and VDDX 91 to ground 15. As such, the ESD detector 310 is pulled to a low state, and in one embodiment, the ESD detector 310 is turned on. Additionally, the active circuitry may draw some leakage current that is strongly depended on the applied voltage at the lines VDD 90 and VDDx 91 (the higher the applied voltage the stronger such current). The leakage paths from such active circuitry provide additional current flow to ground and are supportive to the parasitic capacitors in their function of keeping the supply lines 90 and 91 below the pad voltage during an ESD event to a non-powered IC.

When the ESD detector 310 is in a low state and turned on, the pad 20 is coupled to the transfer circuit 320. The transfer circuit 320 will transfer a portion of the ESD voltage at the pad 20 from the ESD detector 310 to the multi-finger NMOS device 100 via the bias lines 40, 41, and 44. The bias line 40 and the optional bias lines 41 and 44 enable all of the fingers 110 (active and dummy ESD fingers) of the NMOS device 100 to turn-on simultaneously. It is noted that the layout of FIG. 1 is preferably used in conjunction with the entire ESD protection circuit 150.

The voltage limiter 330 serves to limit the voltage at node 312 during an ESD event. As will be discussed in further detail below with regard to FIGS. 4–12, the voltage limiter 330 protects the NMOS device 100 by limiting the biasing voltage to the gate fingers (active and dummy ESD fingers) of the NMOS device, and thereby reduces the risk of hot carrier degradation of the thin gate oxides.

Figure 4:
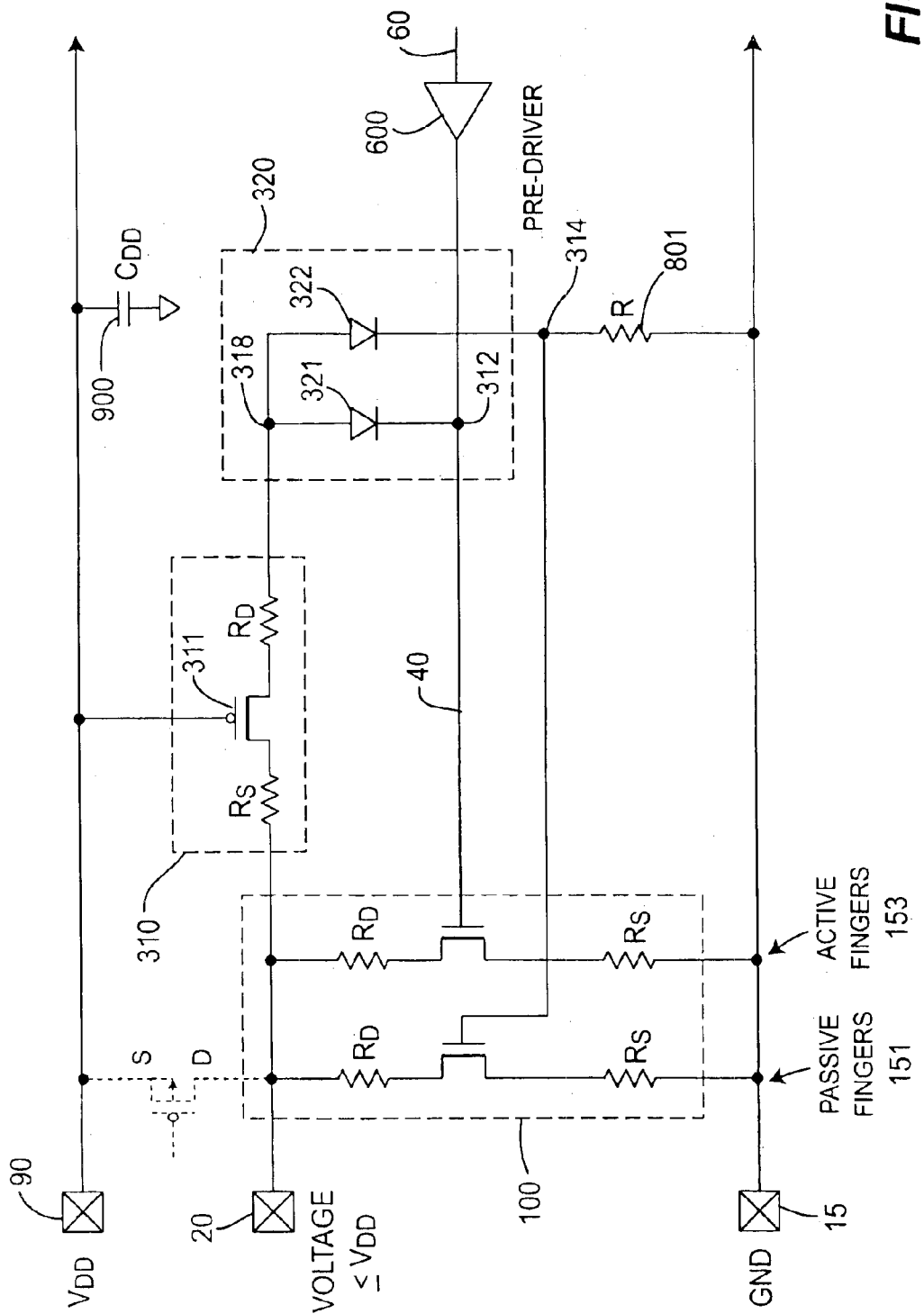
FIG. 4 depicts a schematic diagram of a first embodiment of the multi-finger NMOS device and ESD protection circuit of FIG. 3, including active and passive fingers of the NMOS device.

FIG. 4 depicts a schematic diagram of a first embodiment of the multi-finger NMOS device 100 and ESD control circuit 300 of FIG. 3, including active and dummy fingers 153 and 151 of the NMOS device 100. For a better understanding of the embodiment, FIGS. 3 and 4 should be viewed together. Additionally, for purposes of clarity, the active and dummy (i.e., passive) fingers 153 and 151 of the NMOS device 100 are each shown as a single transistor device, however, one skilled in the art will understand that the single shown active and passive fingers 153 and 151 may each represent multiple fingers.

The multi-finger NMOS transistor device 100 is illustratively shown having ballasting resistor $R_D$ and $R_S$ by active area segmentation or back-end ballasting at the respective drain and source of the NMOS device 100. Recall that in FIG. 1, the ballasted resistors $R_D$ and $R_S$ were formed in each drain segment 122 and source segment 124 of each finger 110. Furthermore, FIG. 1 illustratively shows that the drain finger regions 112 are coupled to the I/O pad 20, the source finger regions 114 are coupled to ground, and the gate regions 116 may be coupled to either ground 15, a pre-driver 600, a local substrate pick-up, or a bias generator, as is discussed in further detail below with regard to each of the embodiments. For purposes of consistency and clarity, the NMOS device 100 is shown in all of the figures having ballasting resistors $R_D$ and $R_S$. However, one skilled in the art will recognize that the invention will work with either back end ballasting resistors or active area segmentation ballasting resistors, or with standard transistor design.

Depending on the type and use of the IC 10, the NMOS device 100 may comprise either active and/or passive fingers. The NMOS device 100 accommodates normal circuit operation via the active fingers 153, while ignoring the passive ESD fingers 151 of the multi-finger NMOS transistor 100. During an ESD event under a non-powered IC state, circuit operation includes both the active and dummy ESD fingers 153 and 151 of the multi-finger NMOS transistor 100, as discussed in detail further below.

Referring to FIGS. 3 and 4 together, the drain and source of each finger 110 of the NMOS device 100 is respectively coupled between the pad 20 and ground 15. Optionally, a PMOS driver 700 (drawn in phantom) may be provided between the supply line VDD 90 and the pad 20.

The ESD detector 310 comprises a back-end ballasted resistance PMOS transistor 311, having the source coupled to the pad 20 and the drain of the multi-finger NMOS device 100. In one alternate embodiment, the PMOS transistor 310 may be silicide blocked to increase its intrinsic ESD robustness. In a second alternate embodiment, the PMOS transistor 310 may be fully silicided to provide ESD hardness, although at a typically lower level of intrinsic ESD hardness with respect to the silicide blocking embodiment.

The gate of the PMOS ESD detector 311 is coupled to the supply line VDD 90, and the source of the PMOS ESD detector 311 is coupled to the pad 20. The drain of the PMOS ESD detector 311 is coupled to the gates of the multi-finger NMOS transistor device 100 via the optional transfer circuit 320. The PMOS ESD detector 311 is used to derive a bias signal and provide a multi-finger turn-on for the entire NMOS device 100. The PMOS ESD detector 311 senses the occurrence of an ESD event to the pad 20.

As illustratively shown in FIG. 4, the transfer circuit 320 comprises a first diode 321 and a second diode 322. The first diode 321 has the anode and cathode respectively coupled to node 318 and to node 312, which is further coupled to the gates of the active fingers 153 of the NMOS device 100. In an instance where all of the fingers of the NMOS device 100 are active, then the transfer circuit may be replaced by a short from the PMOS ESD detector drain to node 312. The pre-driver 600 is also coupled to node 312 to provide the functional gate signal to the gate regions 116 of each active finger 153 of the NMOS device 100. Furthermore, the second diode 322 is coupled has the anode and cathode respectively coupled to node 318 and to node 314, which is further coupled to the gates of the passive dummy ESD fingers 151 of the NMOS device 100.

It is noted that regarding the biasing of the dummy ESD fingers 151, the ground (Shunt) resistor R 801 (e.g., approximately 1 to 100 Kohm) is coupled between the cathode of the second diode 322 and ground 15. The shunt resistor 801 is used to couple the passive dummy ESD fingers 151 to ground 15 during normal circuit operation and to generate a voltage drop (at node 314) for the gate bias of the dummy ESD fingers 151 during an ESD event.

During normal circuit operation, the capacitor $C_{DD}$ 900 is charged, thereby holding the gate of the PMOS detector high (i.e., at the potential of VDD), which is greater than or equal to the potential of the drain and source of the PMOS ESD detector 311. The PMOS transistor ESD detector 311 is turned off, which decouples the ESD detector 310 and diode transfer circuit 321 and 322 from nodes 312 and 314. As such, there is no conductive path between the I/O pad 20 and the gates of the NMOS device 100. Additionally, the pre-driver 600 provides the signaling voltages to the active fingers 153 of the NMOS transistor device 100, as required under normal circuit operation. Recall that the dummy ESD fingers 151 of the NMOS transistor device 100 are decoupled by the diodes 321 and 322 of the transfer circuit 320 from the pre-driver 600, and will not turn on except under non-powered IC and ESD conditions. Thus, the ESD detector 310 (PMOS transistor 311) prevents interference between the ESD protection circuitry 150 and the functional purpose of the IC 10 during normal circuit operation.

During a non-powered IC state, the IC 10 is off and supply line VDD 90 is coupled to ground 15 via parasitic capacitor $C_{DD}$ 900. That is, the gate of the PMOS transistor ESD detector 311 is pulled low to approximately ground potential. Once an ESD event occurs at the pad 20, the source of the PMOS is at a higher potential than the gate of the PMOS transistor ESD detector 311, and the PMOS transistor ESD detector 311 is turned on. The PMOS transistor ESD detector 311 conducts a portion of the ESD current to the gates of both the active and passive fingers of the NMOS transistor device 100 via the transfer circuit (i.e., the first and second diode 321 and 322)

The transfer circuit 320 of FIG. 4 includes the first and second diodes 321 and 322 respectively coupled to the active and passive fingers 153 and 151. During a non-powered IC state and an ESD event at the pad 20, the transfer circuit 320 allows both the active and passive fingers 153 and 151 to be externally biased and simultaneously turned on (i.e., triggered). As such, the non-uniform triggering of the all the fingers 151 and 153 of the NMOS device 100, as discussed above with regard to the prior art, is alleviated. Furthermore, the passive fingers 151 do not interfere with normal IC operation when the IC 10 is powered on. It is noted that the transfer circuit 320 is optional if the NMOS device 100 has only active or only passive fingers, but the transfer circuit is mandatory if the NMOS device has both types of fingers (i.e., split driver).

The optional PMOS transistor driver 700 (drawn in phantom), which is coupled between the supply voltage VDD 90 and the pad 20, may be a part of the functional circuitry of the IC 10. When utilized, the PMOS driver 700 acts during ESD as a forward biased diode between the drain terminal and the N-well terminal to shunt a portion of the ESD current to ground 15, via the supply line VDD 90 and the capacitor $C_{DD}$ 900. Therefore, during the charging of the capacitor $C_{DD}$ 900 during the ESD pulse, the VDD line will be at a potential that is approximately a diode voltage below the voltage at the pad 20. The PMOS ESD detector 311 remains on because the voltage between its gate and source is the same as the diode drop across the PMOS 700, which is typically above the PMOS threshold voltage.

Once the capacitor $C_{DD}$ 900 charges up and the voltage difference between source and gate of the PMOS detector transistor 311 falls below the threshold voltage, the PMOS transistor 311 is turned off. However, the time delay for the capacitor $C_{DD}$ to charge up until PMOS 311 turns off is usually long enough so that the NMOS transistor 110 is fully turned on. Moreover, and alternatively, the supply line VDDx for the pre-driver may be utilized for the PMOS detector transistor 311 as shown on FIG. 3. In particular, the VDDx supply line is not directly charged by the PMOS transistor 700, and therefore keeps the VDDx line capacitively on ground 15 ensuring the PMOS detector transistor 311 stays turned on.

Figure 5:
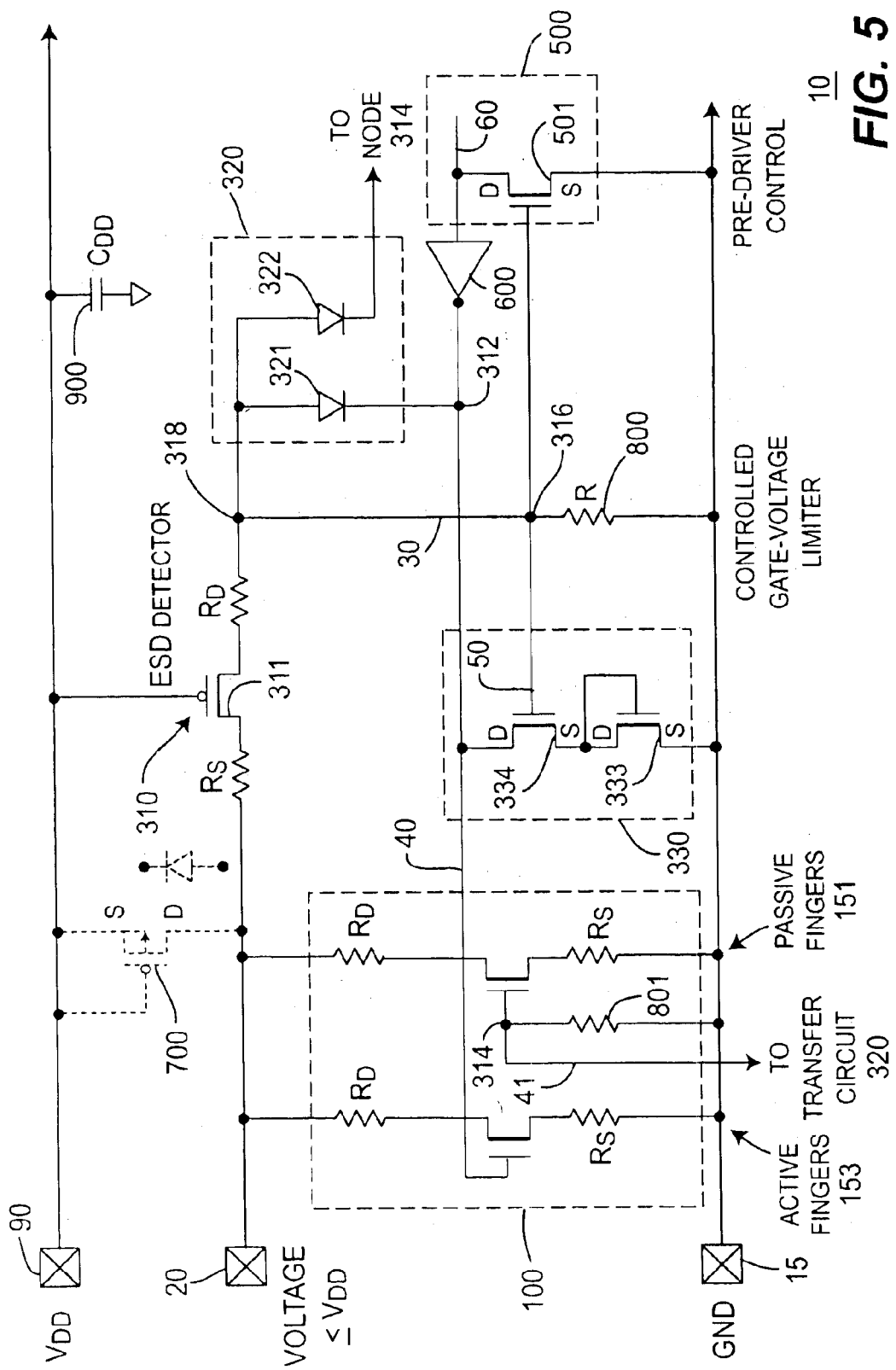
FIG. 5 depicts a schematic diagram of a second embodiment of the multi-finger NMOS device and ESD control circuit of FIG. 3, including a controlled gate-voltage limiter and a pre-driver control.

FIG. 5 depicts a schematic diagram of a second embodiment of the multi-finger NMOS device 100 and ESD control circuit 300 of FIG. 3, including a controlled gate-voltage limiter 330 and a pre-driver control 500. FIG. 5 should be viewed in conjunction with FIGS. 3 and 4. In particular, the second embodiment of FIG. 5 is the same as shown in FIG. 4, except that a pre-driver control 500 has been added, and the transfer circuit 320 and voltage limiter 330 have been modified. It is noted that circuit analysis will be discussed under normal powered IC conditions and non-powered ESD conditions.

In particular, the voltage limiter 330 comprises a pair of cascoded NMOS transistors 333 and 334 serially coupled between the bias line 40 and ground 15. Specifically, a first NMOS transistor 333 has the source coupled to ground 15 and the drain coupled to the source of a second NMOS transistor 334. The drain of the second NMOS transistor 334 is coupled to the bias line 40. The gate of the first NMOS transistor 333 is coupled to a higher potential than the source, such as the drain of the first NMOS transistor 333. The gate of the second NMOS transistor 334 is coupled to node 316.

In this second embodiment, the first and second diode 321 and 322 of the transfer circuit 320 are required, as discussed in the first embodiment of FIG. 4. The first diode 321 is required for coupling a signal to the active fingers 153 of the NMOS transistor device 100, while the second diode 322 enables grounding of the passive fingers 151 during normal operation, and biases the passive fingers 151 during an ESD event. That is, the gates of the passive fingers 151 of the NMOS device 100 are coupled to node 314, which is formed by the second diode 322 and the ground resistor 801, which is further coupled to ground 15. Furthermore, the drain of the PMOS ESD detector 311 is additionally connected to node 316 to provide a bias for the controlled gate voltage limiter 330 during an ESD event, as is discussed in detail below.

A third NMOS transistor 501 forms the functional pre-driver control 500. In particular, the drain and source of the third NMOS transistor 501 are respectively coupled to the input 60 of the pre-driver 600 and ground 15. The gate of the third NMOS transistor 501 is coupled to node 316. It is noted that the pre-driver 600 is an inverting circuit, such as an inverter comprising serially coupled NMOS and PMOS transistors (not shown), or any other logic circuit with an inverting function (NAND, NOR, among others).

During normal IC operation, the first transistor 333 of the cascoded transistors is turned on, while the second transistor 334 of the cascoded transistors of the voltage limiter 330 is turned off. The first transistor 333 is pulled high by hard wiring, while the second transistor 334 is pulled low to ground 15 via a shunt resistor R 800, which is coupled to ground 15. As such, the voltage limiter 330 does not interfere with normal operation of the IC. That is, since the second NMOS transistor 334 is off, the drive current from the pre-driver 600 flows entirely to the active fingers 153 of the multi-finger NMOS device 100 instead of flowing to ground 15 via the voltage limiter 320.

Regarding the pre-driver control NMOS transistor 501, during normal operation, the gate at node 316 is pulled low via the shunt resistor 800, which turns the pre-driver control NMOS transistor 501 off. Therefore, the pre-driver control NMOS transistor 501 has no effect on the input 60 to the pre-driver inverter 600. As such, the pre-driver 600 provides drive current, as required, to the active fingers 153 of the multi-finger NMOS device 100 during normal IC operation.

During an ESD event, the IC is in a non-powered state, and the PMOS ESD detector 320 is turned on, which pulls nodes 318 and 316 high. A voltage drop is formed across shunt resistor 800 to ground 15, which biases the gate and turns on the second transistor 334. As such, both first and second transistors 333 and 334 are turned on, which limits the voltage that is applied to the active fingers 153 of the multi-finger NMOS device 100. Therefore, the voltage limiter 320 is activated only during a non-powered IC ESD event. It is noted that both of the cascoded transistors 333 and 334 of the voltage limiter 330 together provide a voltage drop having a value approximately twice the threshold voltage $V_{TH}$ of the individual transistor 333 and 334.

The high potential at node 316 also turns the pre-driver control NMOS transistor 501 on. Turning the pre-driver control NMOS transistor 501 on, pulls the input of the input to the pre-driver inverter 600 to ground 15, which produces a high output at the pre-driver inverter 600, thereby further providing drive current and gate bias to the active fingers 153 of the multi-finger NMOS device 100 via the biasing line 40.

The passive fingers 151 of the NMOS transistor 100 are connected in parallel to the active fingers 153 as shown in FIG. 5. The gates of the passive fingers 151 are pulled low during normal circuit operation via the resistor 801, as discussed with regard to FIG. 4. Furthermore, it is noted that parts of the ESD control circuit 300 are provided in an identical version (not shown on FIG. 5) to ensure the same biasing for the dummy ESD fingers 151 as for the active fingers 153. In particular, the ESD control circuit 300 comprises a controlled gate voltage limiter 330 and an optional pre-driver control 501 used in conjunction with a dummy pre-driver 600 all together, thereby ensuring the same gate biasing conditions for the dummy fingers 151 as for the active fingers 153.

As such, during an ESD event, the active fingers 153 participate in shunting the ESD current from the pad 20 along with the passive fingers 151. Moreover, both the passive and active fingers 151 and 153 are externally biased at their respective gates and all of the fingers are simultaneously turned on.

Figure 6:
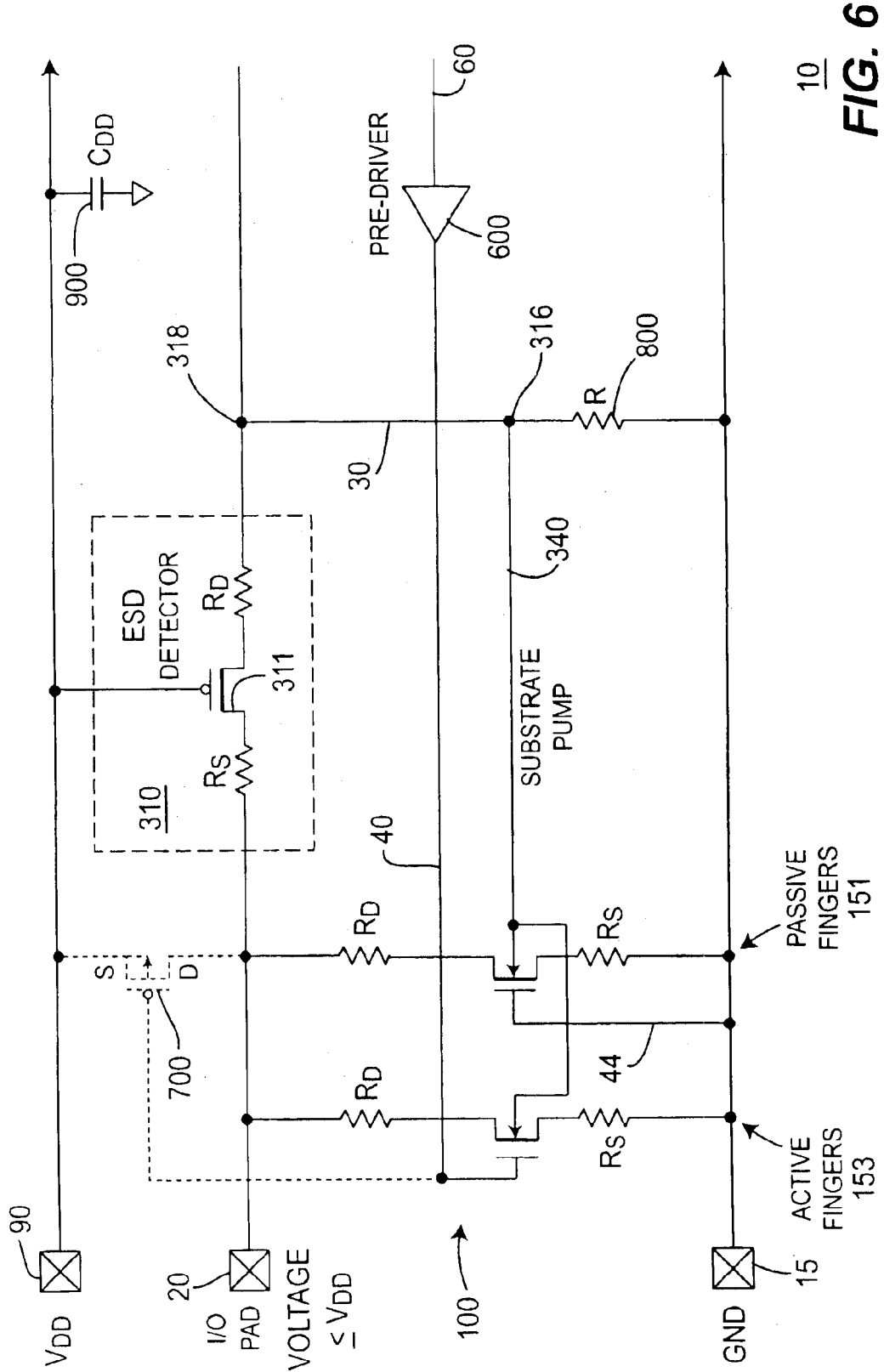
FIG. 6 depicts a schematic diagram of a third embodiment of the multi-finger NMOS device and ESD control circuit of FIG. 3 having a substrate pump.

FIG. 6 depicts a schematic diagram of a third embodiment of the multi-finger NMOS device 100 and ESD protection circuit 300 of FIG. 3 having a substrate pump 340. In particular, the circuit is the same as shown and discussed with regard to FIG. 4, except that the transfer circuit is not needed. A substrate pump is used to bias the local substrate of the passive dummy ESD fingers 151 together with the active fingers 153 of the NMOS transistor device 100.

In particular, during normal IC operation, where the IC 100 is powered on, the parasitic capacitor $C_{DD}$ 900 is charged such that the supply line VDD 90 remains above ground 15 at the supply potential. As such, the PMOS ESD detector 311 is turned off, the pad 20 is decoupled from the ESD control circuit 300, and the substrate ties 120 in all the fingers 110 are grounded via the shunt resistor 800. Moreover, the pre-driver 600 will provide drive current to the active fingers 153 of the NMOS device 100, as required, and the ESD control circuit 300 (and the dummy ESD fingers 151 of the NMOS device 100) will not interfere with the normal operation of the IC 10.

During an ESD event when the IC is in a non-powered state, the gate of the PMOS ESD detector 311 is pulled to a low state, and is turned on. The ESD detector is then coupled to node 316, which is further coupled to ground via the shunt resistor 800.

A substrate pump 340 is formed between the node 316 and the local substrate ties 120 of the dummy ESD fingers 151 and the active fingers 153. Referring to FIG. 1, recall that the plurality of P+ regions (local substrate ties) 120 interspersed between the drain and source segments 122 and 124 were interconnected via a metal grid 132. The metal grid 132 is further coupled to node 316, such that the metal grid 132 and interspersed P+ doped regions 120 form the substrate pump 340.

Once the ESD event occurs, a voltage at node 316 (formed by a voltage drop across the shunt resistor 800) causes the biasing to be distributed across all of the active and passive fingers 153 and 151. That is, the substrate pump 340 provides distributed biasing such that the P+ region local substrate ties 120 act as trigger taps to all the fingers 110. Therefore, the active and passive fingers 153 and 151 will simultaneously turn on to shunt the ESD current to ground 15.

It is noted that this third embodiment does not require a transfer circuit component to turn on the dummy ESD fingers 151 and the active fingers 153 of the NMOS device 100. Rather, the distributed P+ local substrate ties 120, forming the substrate pump 340, simultaneously trigger both the active and passive fingers 153 and 151 of the NMOS device 100. It is further noted that a substrate ring may alternately be used instead of the distributed P+ regions 120 to provide distributed biasing of the active and passive fingers 153 and 151 of the NMOS device 100.

It is also noted in the embodiment shown, the gate of the optional PMOS driver 700 is coupled to the pre-driver 600 and gate of the active fingers 153 of the NMOS device. Alternately, a separate pre-driver (not shown) may be coupled to the gate of the optional PMOS device 700.

In the embodiments shown in FIGS. 4-6, the voltage potential at the I/O pad 20 during normal circuit operation was below the voltage potential at the supply line VDD 90. In alternate embodiments of the multi-finger NMOS transistor device 100 and ESD circuitry, an over-voltage condition may exist, where the voltage potential at the I/O pad 20 is above the voltage potential at the supply line VDD 90. The over-voltage condition usually occurs at the pad 20 from external sources (circuitry) to the IC 10, rather than from the IC 10 itself. In this alternate embodiment, the I/O circuitry of the IC 10 may be said to be "over-voltage tolerant (OVT)", and may be used in an over-voltage condition without circuit malfunction or device degradation during normal IC operation.

Figure 7:
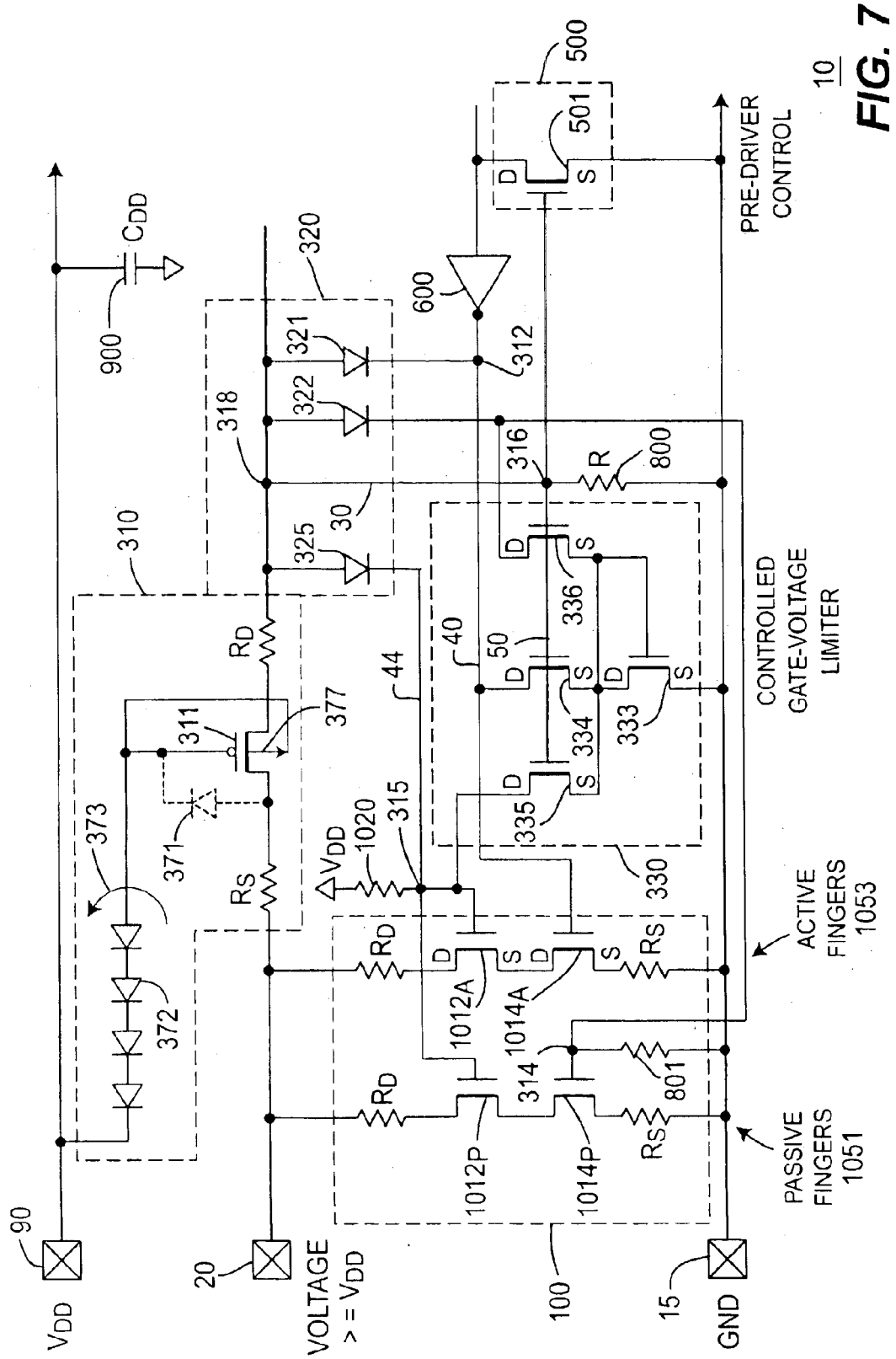
FIG. 7 depicts a schematic diagram of a fourth embodiment of the multi-finger NMOS device and ESD control circuit of FIG. 3 for over-voltage tolerant applications.

FIG. 7 depicts a schematic diagram of a fourth embodiment of the multi-finger NMOS device 100 and ESD control circuit 300 of FIG. 3. In particular, the inventive circuit comprises a cascoded NMOS transistor device 100, an ESD detector 310, a transfer circuit 320., a controlled gate-voltage limiter 330, a pre-driver control 500, and a pre-driver 600, which are configured according to the block diagram of FIG. 3. More specifically, block components of FIG. 7 are configured similar to the schematic diagram of FIG. 5, except for the notable differences as described hereafter.

The NMOS transistor device 100 illustratively comprises passive fingers 1051 and active fingers 1053. Each finger comprises two cascoded NMOS transistors (i.e., first and second cascoded transistors 1012 and 1014) coupled in series between the pad 20 and ground 15. For example, passive finger 1051 comprises first and second cascoded transistors $1012_p$ and $1014_p$, while active finger 1053 comprises first and second cascoded transistors $1012_a$ and $1014_a$. For purposes of clarity, it is noted that the subscripts "a" and "p" respectively identify the cascoded transistors as being active and passive transistors.

In one embodiment, each NMOS transistor 1012 and 1014 has a similar layout structure as shown and discussed with regard to FIGS. 1 and 2A–2C. It is further noted that the ballasted drain and source resistances $R_D$ and $R_S$ are utilized to enhance ESD robustness of the NMOS. Alternately, silicide blocking or a fully silicided NMOS transistor device 100 may be utilized. The NMOS transistor is typically cascoded to limit the drain-gate voltage at each stage and prevent damage to the gate oxides.

Figure 9:
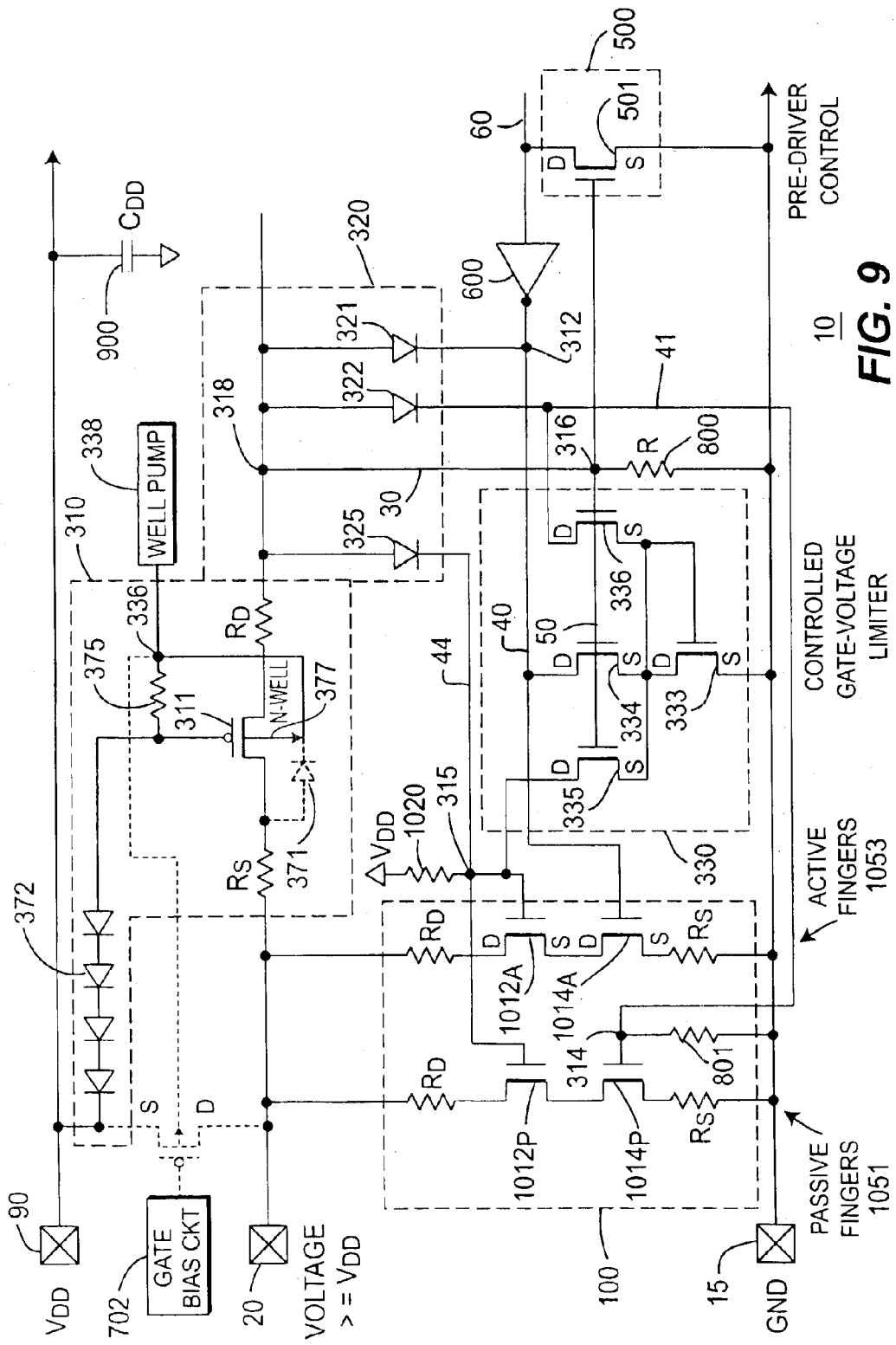
FIG. 9 depicts a schematic diagram of a sixth embodiment of the multi-finger NMOS device and ESD control circuit of FIG. 3 for over-voltage tolerant applications.

The circuit of FIG. 7 is termed an open-drain NMOS device, since the pad 20 is only coupled to the drain (of the first transistor 1012) of the cascoded NMOS device 100, as opposed to additionally having a PMOS driver 700 coupled between the supply line VDD 90 and the pad 20, as illustratively shown in FIG. 9. The circuit of FIG. 7 is used where the PMOS driver 700 is not required for IC functionality.

ESD detector 310 comprises the PMOS transistor 311 and a plurality of diodes 372. In particular, the source of the PMOS transistor is coupled to the pad 20, while the drain is coupled to the transfer circuit 320. The gate of the PMOS transistor is coupled to the plurality of diodes 372, which are coupled to the supply line VDD 90 with the cathodes directed towards the VDD line and the anodes directed towards the gate and N-well tie 377 of the PMOS 311.

During normal circuit operation where the IC 10 is powered on, if the voltage at the pad 20 exceeds the supply line voltage VDD 90, then the plurality of diodes 372 plus a source-Nwell diode 371 formed in the PMOS ESD detector transistor 311 form a diode chain 373 from the pad 20 to the supply line VDD 90. The voltage drop across the plurality of diodes 372 is used to ensure that the PMOS detector transistor 311 is not turned on during an over-voltage condition under normal circuit operations conditions. Typical over-voltage conditions range up to 3 volts above the potential of the supply line VDD 90. During an ESD event, a similar but distinctively higher over-voltage condition will exist, while the supply line VDD 90 is capacitively coupled to ground. There will be current flow through the diode chain 373 to the capacitively grounded VDD line 90, and the voltage drop across the source/Nwell diode 371 will provide the necessary source-gate voltage to turn-on the PMOS detector transistor 311.

During an over-voltage condition under normal operation, all of the diodes in the diode chain 373 operate in slight forward biased mode but practically in a non-conductive state, such that a voltage of 0.2–0.4 volts forms across each diode. In FIG. 7, the plurality of diodes illustratively comprises four diodes, and the PMOS transistor 311 forms a fifth diode in the diode chain 373, such that a voltage drop between 1.0 and 2.0 volts can appear between the pad 20 and supply line VDD 90 without any significant current from the pad to the VDD line. The number of diodes in the diode chain 373 is a design consideration dependent on the external over-voltage applied to the IC 10 and the threshold voltage of the PMOS detector transistor 311, which must not be exceeded by the voltage drop of the diode 371 of the PMOS 311.

For example, if an over-voltage condition will arise where the pad 20 has a potential of 5.0 volts and the supply line VDD 90 is 3.3 volts, then the over-voltage is 1.7 volts. That is, each of the five diodes of the diode chain 373 (i.e., four diodes forming the plurality of diodes 372 plus diode 371) will have a voltage drop of 0.34 volts. Moreover, the PMOS detector transistor 311 is assumed to have a threshold voltage of 0.5V in this example. As such, a diode chain 373 comprising 5 diodes (as shown in FIG. 7) is sufficient to equalize the potential between the pad 20 and the supply line VDD 90 without any significant current flow, while also maintaining the PMOS detector transistor 311 in off state.

As such, the ESD detector embodiment of FIG. 7 is compatible with the over-voltage tolerant condition under normal IC operation because the diode chain 373 of the ESD detector 310 prevents any current from flowing from the pad 20 to the supply line VDD 90. The ESD detector 310 senses whether the IC is operating under normal powered-on IC conditions (including the over-voltage condition) or non-powered (over-voltage) ESD conditions.

The pre-driver 600 is coupled to the gates of the second cascoded transistors $1014_a$ of the active fingers 1053 of the NMOS device 100, while in one embodiment, the gates of the first cascoded transistors $1012_a$ of the active fingers 1053 are coupled through a resistor 1020 to the supply line VDD 90. Resistor 1020 may be any resistive element (typically above 1 kOhm) and is required to avoid loss of the gate bias during ESD to the capacitively grounded supply line 90, while during normal operation conditions, the gate is biased to VDD as required for the operation of the cascoded NMOS transistor 100.

The controlled voltage limiting circuit 330 comprises the shunt resistor 800 coupled between node 316 and ground 15. Furthermore, the cascoded first and second voltage-limiting NMOS transistors 333 and 334 are coupled between biasing line 40 at node 312 and ground 15, as discussed above with regard to FIG. 5. That is, the cascoded first and second voltage-limiting NMOS transistors 333 and 334 are coupled between the gate of the second NMOS transistor $1014_a$ of the active fingers 1053 and ground 15.

A third and a fourth voltage-limiting NMOS transistor 335 and 336 are also each coupled serially (cascoded) with the first voltage-limiting NMOS transistor 333. Specifically, the NMOS transistor 335 has the drain coupled to the node 315 (i.e., gates of the first cascoded active as well as dummy ESD NMOS transistor 1012 of the NMOS device 100). The NMOS transistor 336 has the drain coupled to the gate of the second transistor $1014_p$ of the dummy ESD fingers. The sources of the third and fourth voltage-limiting NMOS transistors 335 and 366 are coupled to the source of the second voltage-limiting NMOS transistor 334 as well as to the drain of the first voltage limiting NMOS transistor 333. The gates of the second through fourth voltage-limiting NMOS transistors 334–336 are coupled to the node 316.

During normal IC operation, the first transistors $1012_a$ and $1012_p$ of the active fingers 1053 and dummy ESD fingers 1051 are turned on, the second transistor $1014_a$ of the active fingers 1053 provides the switching action for the signal and as discussed with regard to the embodiments of FIGS. 3–6. The second transistor $1014_p$ of the ESD dummy fingers 1051 is off because its gate is pulled to ground 15 via a resistor 801, such that the ESD dummy fingers 1051 are not utilized during normal IC operation. The PMOS ESD detector 311 is off, which decouples the transfer circuit 320 and voltage limiter 330 from the NMOS device 100.

Furthermore, during normal IC operation, the first transistor 333 of the voltage limiting transistors is turned on, while the second through fourth voltage-limiting transistors 334 through 336 of the voltage limiter 330 are turned off. In particular, the gate of the first voltage-limiting transistor 333 is pulled high by hard wiring, while the gates of the second through fourth voltage-limiting transistors 334 through 336 are pulled low to ground 15 via the shunt resistor R 800. As such, the voltage limiter 330 does not interfere with normal operation of the IC. Since the second voltage limiting NMOS transistor 334 is off, the drive current from the pre-driver 600 flows entirely to the active fingers 153 of the multi-finger NMOS device 100, instead of flowing to ground 15 via the voltage limiter 320 (i.e., flowing through voltage limiting NMOS transistors 333, and 334). Where the pre-driver 600 comprises an inverter circuit, the optional pre-driver controller 500 may be utilized to provide additional bias to the second transistor $1014_a$ of the active fingers of the NMOS device 100 as discussed in regard to FIGS. 5 and 7.

During non-powered ESD conditions, the IC 10 is turned off. When an ESD event occurs at the pad 20, the gate of the PMOS transistor ESD detector 311 is pulled low to ground 15, via parasitic capacitor 900, which turns the ESD detector 310 on. The ESD detector 310 passes part of the ESD current to the transfer circuit 320 (via diodes 321, 322, and 325), which turns on both the active and passive dummy ESD cascoded fingers 1053 and 1051 of the NMOS device 100.

Regarding the biasing and turn-on of the transistors 1012 and 1014 of the active fingers 1053 and dummy ESD fingers 1051, the transfer circuit 320 comprises diodes 321, 322, and 325. Diode 321 has the anode and cathode respectively coupled to node 318 and to node 312, which is coupled to the gate of the second cascoded NMOS transistor $1014_a$ of the active finger 1053 of the NMOS device 100. Diode 322 has the anode and cathode respectively coupled to node 318 and to node 314, which is coupled to the gate of the second cascoded NMOS transistor $1014_p$ of the dummy ESD fingers 1051.

Diode 325 has the anode and the cathode respectively coupled to node 318 and to the gate of the first NMOS transistor 1012. In particular, diode 325 is coupled at node 315 formed between the resistor 1020 and the gate of the first NMOS transistor 1012 of the NMOS device 100. During an ESD event the supply line VDD 90 is capacitively coupled to ground 15. The resistor 1020 prevents the current to flow from node 318, through diode 325, to ground 15 via supply line VDD 90. As such, the resistor 1020 ensures biasing of the gates of the first transistors $1012_a$ and $1012_p$.

Furthermore, during an ESD event, all transistors 333 through 336 of the voltage limiting circuit 330 are turned on. In particular, the gate of the first voltage-limiting transistor 333 is pulled high by hard wiring, while the gates of the second through fourth voltage-limiting transistors 334 through 336 are pulled high at their respective gates at node 316. As such, the voltage limiter 330 is only active during ESD and does not interfere with normal operation of the IC. When the second through fourth voltage-limiting transistors 334 through 336 are turned on, the gate biasing at the first and second cascoded NMOS transistors 1012 and 1014 of the active fingers 1053 and the dummy ESD fingers 1051 is limited but sufficiently high to ensure uniform turn-on of all fingers of the cascoded NMOS transistor 100.

It is noted that instead of the previously discussed gate-biasing method, the substrate biasing method, as discussed with regard to FIG. 6, is also a possible embodiment for uniform turn-on of the cascoded NMOS transistors 1012 and 1014. Again, as already mentioned in the context of FIG. 6, the illustrative layout as shown in FIGS. 1 and 2A–2C provides distributed biasing of the substrate and simultaneous turn-on of all the cascoded transistors $1012_p$ and $1014_p$ of the passive fingers 1051, as well as the cascoded transistors $1012_a$ and $1014_a$ of the active fingers 1053. Essentially, the same biasing scheme as in FIG. 6 is utilized and no interference with the pre-driver will take place.

Figure 8:
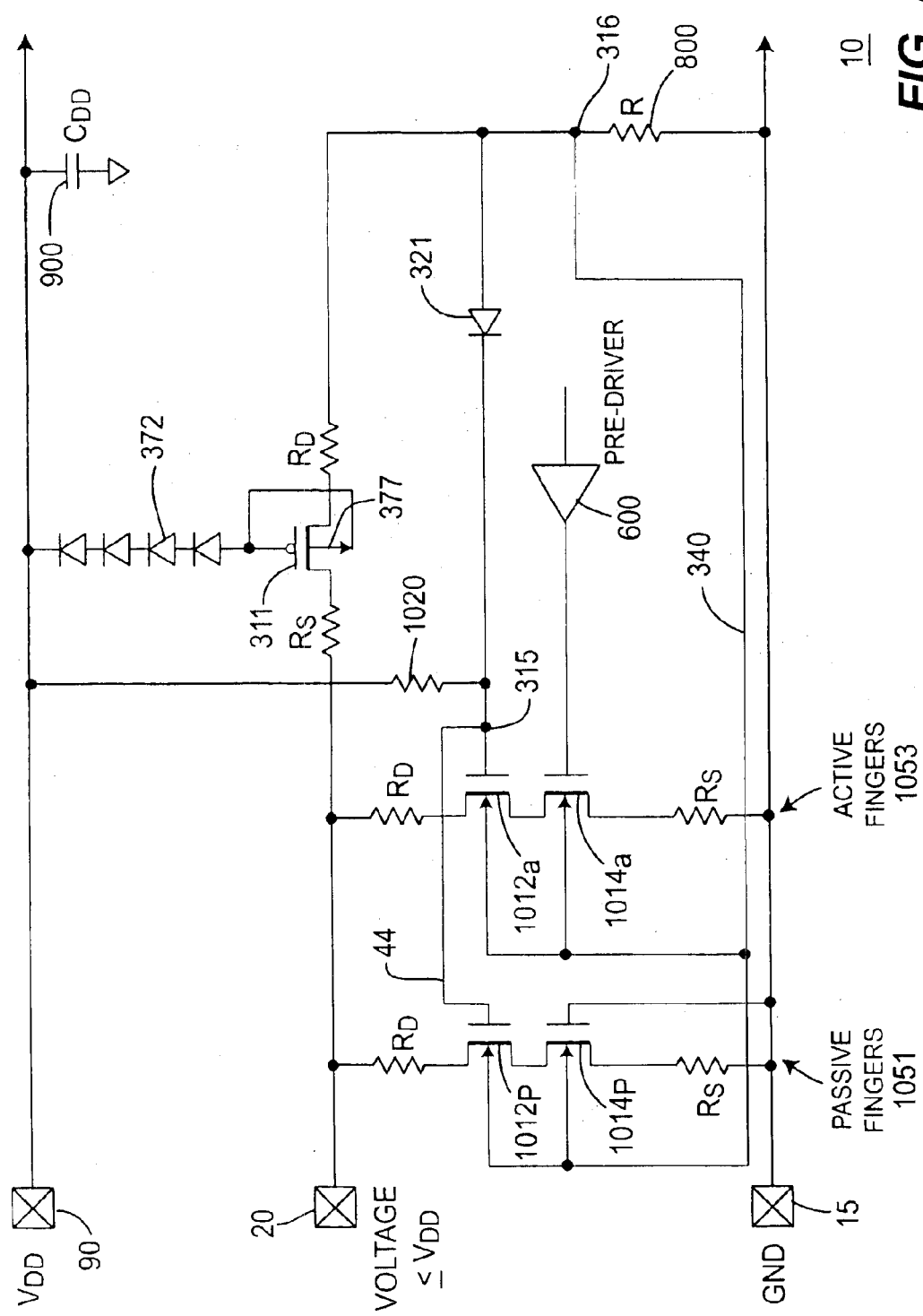
FIG. 8 depicts a schematic diagram of a fifth embodiment of the multi-finger NMOS device and ESD control circuit of FIG. 3 having a substrate pump.

FIG. 8 depicts a schematic diagram of a fifth embodiment of the multi-finger NMOS device and ESD protection circuit of FIG. 3 having a substrate pump. In particular, FIG. 8 is similar to the circuit shown in FIG. 6 having a substrate pump 340 biasing both the active in passive fingers 153 and 151 of the NMOS device 100. Furthermore, FIG. 8 is the same as the embodiment of FIG. 7, except that the transfer circuit 320, voltage limiter 330, pre-driver control 500, and ground resistor 801 are not provided.

Referring to FIG. 8, the first cascoded transistors 1012 of the active and passive fingers 1053 and 1051 are coupled to the supply line VDD 90 via resistor 1020. A diode 321 has its anode and cathode respectively coupled to the drain of the PMOS ESD detector transistor 311 and to the gates of the first cascoded transistors $1012_a$ and $1012_p$, as discussed above with regard to FIG. 7. The gates of the second cascoded NMOS transistor $1014_a$ of the active fingers 1053 are coupled to the pre-driver 600, as also discussed with regard to FIG. 7. The gates of the second cascoded NMOS transistor $1014_p$ of the passive fingers 1051 are coupled to ground 15.

Moreover, the local substrates of both cascoded transistors 1012 and 1014 of the active and passive fingers 1053 and 1051 are coupled, via the substrate pump 340, to node 316, which is formed between the drain of the PMOS ESD transistor 311 and the ground resistor 800. During an ESD event when the IC 10 is non-powered, the substrate pump 340 simultaneously self-biases the active and passive fingers 1053 and 1051, in a similar manner as discussed with regard to FIG. 6. That is, the distributed P+ substrate ties 120 that are electrically connected (FIG. 1), simultaneously turns on the active and passive fingers 1053 and 1051 of the NMOS device 100. Although FIG. 1, depicts a single MOS multi-finger layout, it is understood by those skilled in the art that a cascoded MOS multi-finger layout comprises two gates having an additional N+ region disposed therebetween, where the P+ substrate tie regions 120 are interspersed in a similar manner as shown in FIG. 1.

FIG. 9 depicts a schematic diagram of a sixth embodiment of the multi-finger NMOS device and ESD protection circuit of FIG. 3. The schematic diagram is the same as shown and described with regard to FIG. 7, except for the notable distinctions discussed below.

The I/O pad 20 is capable of outputting signals to other circuitry from the IC 10, as well as receiving input signals from other circuitry (not shown) to the IC 10. When the I/O pad 20 receives an input signal, the signal may be higher that the supply line VDD 90, such that an over-voltage condition exists between the pad 20.and supply line VDD 90. If an over-voltage condition arises, then precautions must be taken to prevent malfunctioning of the output circuit, such as sinking of the input signal into to the VDD line. Where there is no PMOS drive 700 present, then one solution is provided as discussed above with regard to FIG. 7.

Where the PMOS driver 700 is utilized for functional aspects of the IC 10, then an N-well bias generator (well-pump) 338 is also included to avoid sinking of the over-voltage signal from the pad 20 into the supply line VDD 90, which is at a lower potential than the pad 20. The well-pump 338 is coupled to the N-well at node 336 of the PMOS ESD detector 311. The well-pump 338 tracks the voltage potential at the I/O pad 20 and senses an over-voltage condition. It is noted that one skilled in the art will understand how to configure the circuitry of the well-pump 338.

In particular, the PMOS transistor ESD detector 311 has a source to N-well diode 371 formed between the source and N-well of the PMOS ESD detector transistor 311. During normal IC operation, and when the I/O pad 20 is functioning as a pad for receiving an input signal, an over-voltage condition will forward bias the source-N-well diode and conduct the input signal to the supply line VDD 90, rather than to the circuitry of the IC that is supposed to receive such input signal.

To alleviate this problem, the circuitry of the well-pump 338 senses the voltage applied to the I/O pad, and couples the N-well of the PMOS ESD detector transistor 311 to the input pad 20 during an over-voltage condition at the pad 20. Conversely, when there is no over-voltage condition during normal circuit operation, the well-pump 338 couples the N-well of the PMOS ESD detector transistor 311 to the supply line VDD 90.

Another problem may arise where, during an ESD event, the N-well and the gate of the PMOS ESD detector transistor 311 follow the voltage potential at the pad 20 too quickly, because of the presence of the well-pump 338. The PMOS ESD detector 311 may not be able to determine if an over-voltage condition or an actual ESD event is occurring at the pad 20. As such, the PMOS ESD detector 311 may properly stay off during normal operation. However, the PMOS ESD detector transistor 311 may also improperly stay off while sensing an ESD event, when in actuality, a similar over-voltage condition exists at the pad 20 that is typically larger than under normal operating conditions.

To alleviate this problem, in one embodiment, a voltage-limiting resistor 375 is coupled at node 336 of the N-well and to the gate of the PMOS ESD detector 311. The voltage-limiting resistor 375 has a resistance value in the range of 1 to 100 Kohms, and is used to provide gate biasing of the PMOS ESD detector transistor 311. That is, during normal IC operation, an over-voltage condition at the pad 20 produces only a small voltage drop across the voltage-limiting resistor 375, and which is below the threshold voltage of the PMOS 311, thereby keeping the PMOS ESD detector transistor 311 off.

In particular, during an ESD event at the pad 20 when the IC 10 is non-powered, the gate must be lower than the source of the PMOS transistor 311 in order for the PMOS transistor 311 to turn on. However, the well-pump 338 will sense the ESD event at the pad 20 as an over-voltage condition, and will attempt to couple the N-well and the gate of the PMOS ESD detector transistor 311 to the pad 20, thereby turning the PMOS ESD detector transistor 311 off. Turning the PMOS ESD detector transistor 311 off during an ESD event at the pad 20 is detrimental to the circuitry of the IC 10.

To solve this problem, in one embodiment, the voltage-limiting resistor 375 between the N-well and gate of the PMOS ESD detector transistor 311, limits the current of the well-pump 338 to the diode chain 372. During an ESD event, the over voltage condition is stronger and the current in the resistor 375, such that the diode chain 372 to the VDD line is now highly supported by some portion of the ESD current. As such, a voltage drop is generated across the resistor 375, which is above the PMOS threshold voltage, thereby turning on the PMOS detector transistor 311.

Figure 10:
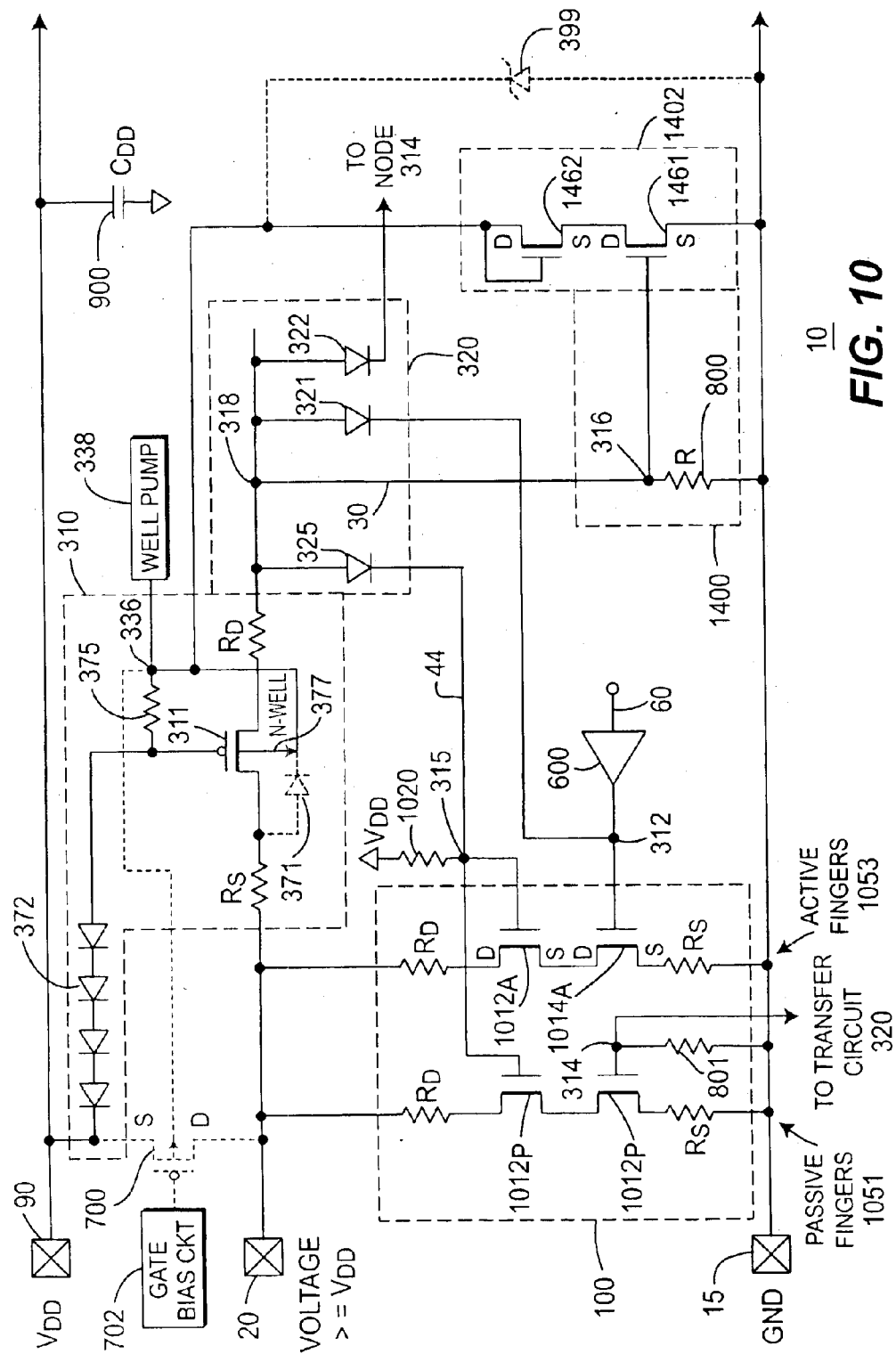
FIG. 10 depicts a schematic diagram of a seventh embodiment of the multi-finger NMOS device and ESD control circuit of FIG. 3 for over-voltage tolerant applications.

FIG. 10 depicts a schematic diagram of a seventh embodiment of the multi-finger NMOS device and ESD protection circuit of FIG. 3. FIG. 10 depicts a second embodiment for solving the problem of the well-pump 338 improperly turning the PMOS ESD detector transistor 311 off during a non-powered IC condition and ESD event at the pad 20. The circuit shown in FIG. 10 is the same as shown and described in FIG. 9, except for the notable aspects described below.

In particular, an N-well pull-down loop 1400 is added to the circuit shown in FIG. 9. Although not shown in FIG. 10, a person skilled in the art will recognize that the voltage limiter circuitry 330 of the ESD protection circuit 300 may be included in the present embodiment of the invention. The N-well pull-down loop 1400 comprises two cascoded NMOS transistors 1461 and 1462 and the ground resistor 800. The first cascoded NMOS transistor 1461 has the source coupled to ground 15 and the gate coupled to node 316 of the voltage limiter circuit 330. The drain of the first cascoded NMOS transistor 1461 is coupled to the source of the second cascoded NMOS transistor 1462. The gate is coupled to the drain, and the drain of the second cascoded NMOS transistor 1462 is coupled to the node 336 at the PMOS ESD detector transistor 311.

In an alternative embodiment, a breakdown device 399 is provided between the N-well tie 377 of the PMOS ESD detector transistor 311 and ground 15. The breakdown device 399 may be provided either in conjunction with or in the alternative to the pull-down loop 1400, and may comprise a Zener diode, a regular junction diode, and a grounded gate NMOS device, among others. In particular, the cathode of the breakdown device 399 is coupled to the N-well tie 377 of PMOS ESD detector transistor 311 and the anode is coupled to ground. The breakdown voltage of the breakdown device 399 is above any supply voltage and signal level, but is below any critical oxide breakdown voltage.

During normal IC operation, the PMOS ESD detector transistor 311 and N-well pull-down loop 1400 are off because the gate of the first transistor 1461 is pulled low via the resistor 800. The breakdown device 399 is not conducting any current besides its intrinsic leakage current. The PMOS ESD detector transistor 311, as well as the N-well pull-down loop 1400 do not contribute to the normal circuit operation, except during an over-voltage condition as discussed with regard to FIG. 7.

During a non-powered IC state and ESD event at the pad 20, both the PMOS ESD detector transistor 311 and N-well pull-down loop 1400 must be considered. In particular, once the PMOS ESD detector transistor 311 turns on, the voltage potential at node 316 increases, thereby turning on the first cascoded NMOS transistor 1461. The second cascoded NMOS transistor 1462 is normally on, since the gate is coupled to the higher potential at the drain. The purpose of the second NMOS transistor 1462 is to comply with the maximum voltage limitation across a gate oxide.

The N-well of the PMOS ESD detector transistor 311 (i.e., node 336) is pulled low via the N-well pull-down loop 1400, and the output current of the well pump 338 is largely shunted to ground. Consequently, a voltage drop across the source-Nwell diode 371 is generated, while a voltage drop across the resistor 375 is prevented. As such, the gate of the PMOS ESD detector transistor 311 is held below the source and will turn on the PMOS ESD detector transistor 311 even stronger to allow more current to flow. The pull down loop 1400 enhances this effect by positive feedback and maintains the PMOS ESD detector transistor 311 in an on state. As such, the N-well pull-down loop 1400 counteracts the tendencies of the well-pump 338 to couple the gate and the N-well of the PMOS ESD detector transistor 311 to the pad 20, which would thereby keep the PMOS ESD detector transistor 311 in an off state.

If the alternative breakdown device 399 is used, the current flowing during an ESD event through the device 399 prevents again the potential of the N-well to follow the voltage at the pad 20 and keeps the N-well voltage below the pad voltage. Like the pull-down loop 1400, the breakdown device 399 counteracts the tendencies of the well-pump 338.

In contrast to the pull-down loop 1400, the breakdown device 399 does not need an initial slight conduction in the PMOS detector 311 to become active. As such, the breakdown device 399 is able, during an ESD event, to keep the N-well and the gate of the PMOS detector 311 below the pad voltage, and thereby turns the PMOS detector on. This means that the diode chain 372 is no longer needed and the resistor 375, between well-pump 338 and the gate of PMOS detector, can be replaced by a short. The important advantage for circuit applications is that the ESD protection circuit 150 is now compliant with the so-called Fail-Safe requirement. In particular, the supply lines VDD 90 and VDDX 91 can be hard-grounded during normal circuit operation, while the voltage at the pad 20 can still be above the regular VDD level, and no malfunction occurs.

The embodiments shown and described above with regard to FIGS. 1–10 provide various techniques to simultaneously turn on multiple fingers of an NMOS transistor device, which is used as an output driver and/or ESD protection device. The circuits used to describe the invention are defined as blocks or "modules", as shown in FIG. 3, to provide better understanding of the invention. One skilled in the art will recognize that alternate embodiments of the circuits in each of the blocks of FIG. 3 are also possible.

In the case where a library I/O cell has unused driver fingers, typically a second set of components including a second pre-driver control 500, transfer circuit 320, and voltage limiter 310 are further required. The second set of components is necessary to ensure that during an ESD event at the pad 20, all the driver gates of the NMOS device 100 are biased together, rather than having the gates of the unused driver fingers held at ground, such that the unused driver fingers have difficulties to trigger and are prone to not contribute to the ESD protection.

FIGS. 11 and 12A through 12D below provides additional embodiments for various portions (i.e., blocks) of the invention. The additional embodiments illustratively include noteworthy complementary components that are useful for a library I/O cells.

Figure 11:
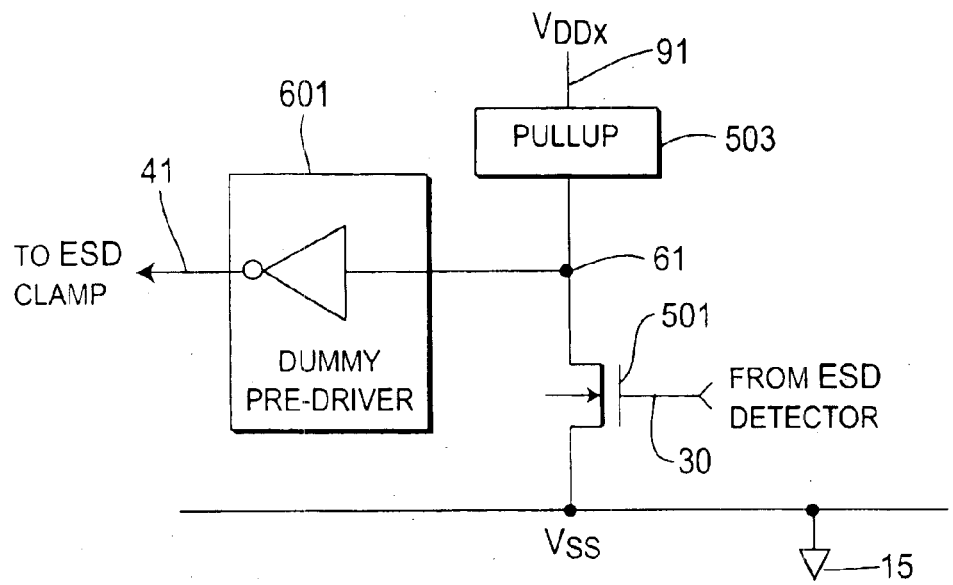
FIG. 11 depicts a schematic diagram of a dummy ESD pre-driver coupled to the NMOS device and ESD control circuit of FIG. 3.

FIG. 11 depicts a schematic diagram of a dummy ESD pre-driver 601 and pre-driver control 501 coupled to the NMOS device 100 and ESD control circuit 300 of FIG. 3. In particular, a dummy pre-driver 601 is shown as an inverting circuit, having the output line 41 (see also FIG. 3) coupled to the dummy ESD fingers 151 of the NMOS device 100. The NMOS transistor 501 of the pre-driver control 500 is coupled with the drain to the input line 61 of the dummy pre-driver 601 and with the source to ground 15. The gate of the pre-driver control NMOS transistor 501 is coupled to the ESD detector 310 to switch the pre-driver control NMOS transistor 501 on and off, as discussed above with regard to FIG. 5. A pull-up device 503, such as a resistor, is coupled to a voltage potential above ground 15, (e.g., supply lines VDD 90 or VDDx 91) and the input line 61 of the dummy pre-driver 601.

The dummy pre-driver 601 and pre-driver control circuitry 501 and 503 similarly provide gate biasing to the dummy fingers 151 of the multi-finger NMOS transistor device 100, as discussed with regard to the pre-driver 600 and pre-driver control 500 of FIG. 5. That is, the dummy pre-driver 601 is used for the dummy driver fingers 151 in split function drivers, and is designed to make the regular pre-driver 600 match the biasing requirements for the active driver fingers 153 of the NMOS transistor device 100.

Figure 12A:
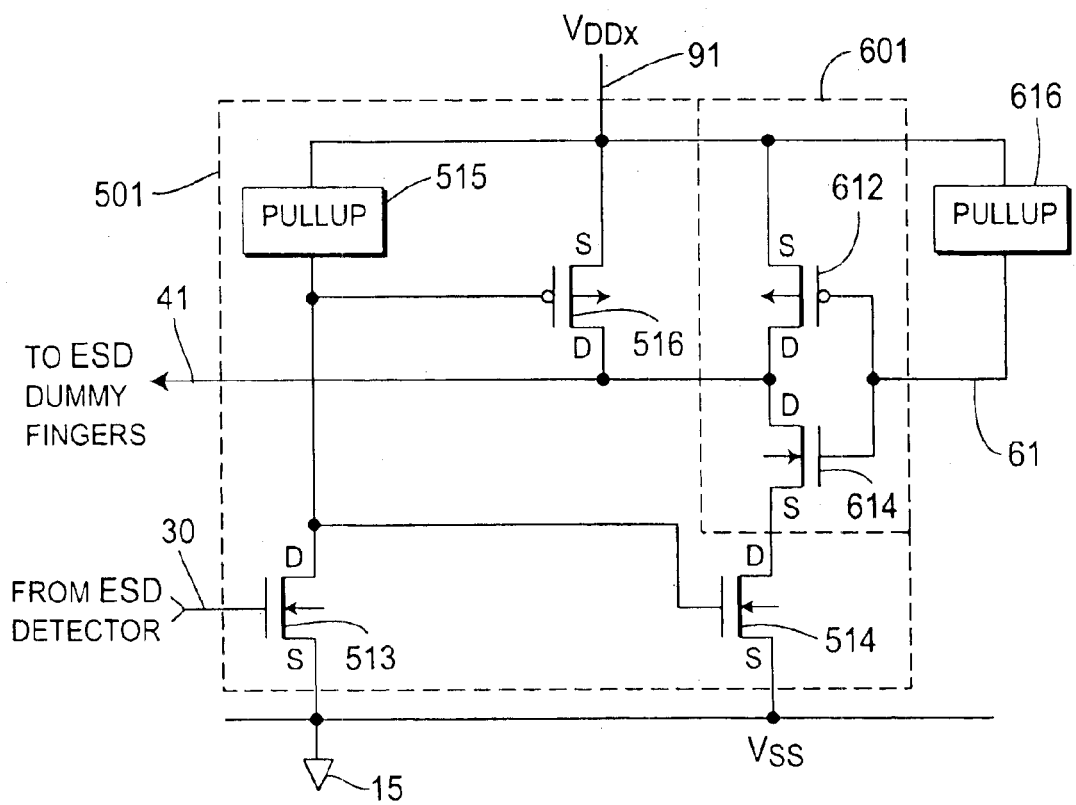
FIGS. 12A through 12D depict schematic diagrams of various embodiments of the dummy ESD driver, ESD driver and pre-driver control of FIG. 3.

FIGS. 12A through 12D depict schematic diagrams of various embodiments of the dummy ESD pre-driver 601, pre-driver 600, and pre-driver control 500 of FIG. 3. FIG. 12A is a schematic diagram utilized in conjunction with the dummy ESD pre-driver 601 of FIG. 11. The dummy ESD driver 601 is formed by an inverter circuit comprising serially coupled PMOS and NMOS transistors 612 and 614, where the source of the PMOS transistor 612 is coupled to a supply line (e.g., VDDx 91) and the drain of the PMOS transistor 612 is coupled to the drain of the NMOS transistor 614 forming the output of the inverter. The gates of transistors 612 and 614 are coupled together forming the input of the inverter and coupled to the supply line VDDx 91 via a pull-up device 616, such as a resistor.

The pre-driver control 501 comprises NMOS transistors 513 and 514, PMOS transistor 516, and a pull-up device 515. The NMOS transistor 514 is coupled from the source of the NMOS transistor 614 of the pre-driver 601 to ground 15. PMOS transistor 516 is coupled from the supply line VDDx 91 to the drains of the inverter transistors 612 and 614, as well as to the gates of the dummy ESD fingers 151 of the NMOS transistor device 100 via line 41. The gate of the PMOS transistor 516 is also coupled to the supply line VDDx 91 via pull-up device (e.g. a resistor) 515. NMOS transistor 513 is coupled from the pull-up device 515 and the gate of NMOS transistor 514 to ground 15. The gate of the NMOS transistor 513 is biased by ESD detector 310 via line 30.

Figure 12B:
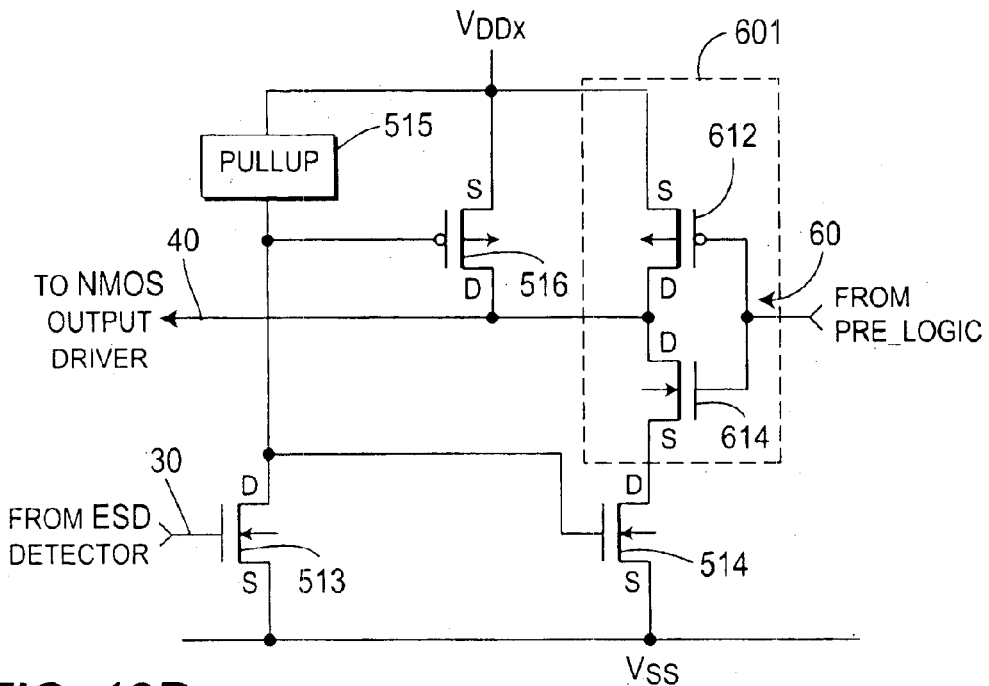

Referring to FIG. 12B, it is noted that the configuration is the same as shown in FIG. 12A, except that the inverter pre-driver 600 is alternately coupled to the gates of the active fingers 153 of the multi-finger NMOS transistor device 100 via line 40 and that the input 60 of the inverter pre-driver receives a signal from some pre-driver logic. For either embodiment in FIGS. 12A and 12B, during an ESD event, transistor 513 is turned on by the PMOS ESD detector 310, which pulls the gates of transistors 514 and. 516 low. The PMOS transistor 516 is turned on, thereby coupling the lines 40 and/or 41 to supply line VDDx 91, which biases the gates of the unused passive fingers 151 (dummy ESD fingers) and the gates of the active fingers 153 of the NMOS device 100. Furthermore, the transistor 514 is turned off, thereby preventing the inverter device 601 from pulling either lines 40 or 41 low, which would act in opposition to the gate biasing transistor 516.

Figure 12C:
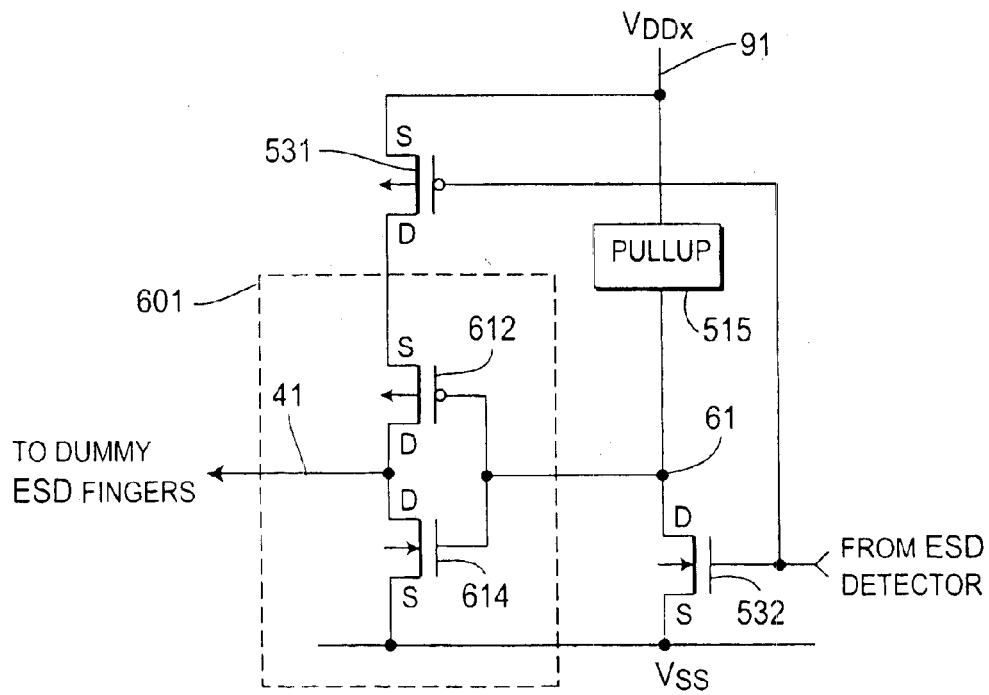

FIG. 12C illustrates alternate dummy pre-driver 601 and pre-driver control 501 circuits, which may be used with the multi-finger NMOS device 100. In particular, the dummy ESD driver 601 is formed by an inverter circuit comprising serially coupled PMOS and NMOS transistors 612 and 614, where the source of the NMOS transistor 614 is coupled to ground 15 and the drains of the NMOS and PMOS transistors 614 and 612 are serially coupled.

The pre-driver control 501 comprises a PMOS transistor 531 serially coupled to the source of the PMOS transistor 612 of the inverter 601, and the supply line VDDx 91. The gates of the pre-driver transistors 612 and 614 are coupled to a pull-down NMOS transistor 532, which is further coupled to ground 15. The gates of the pre-driver transistors 612 and 614 are also coupled to a pull-up device 515 (e.g., resistor), which is coupled to the supply line VDDx 91. The ESD detector 310 is coupled to the gates of the pre-driver control transistors 531 and 532 to control the turn-on of the pre-driver 601. The output of the dummy pre-driver 601 is connected to the gates of the dummy ESD fingers 151 of the multi-finger NMOS transistor 100.

Figure 12D:
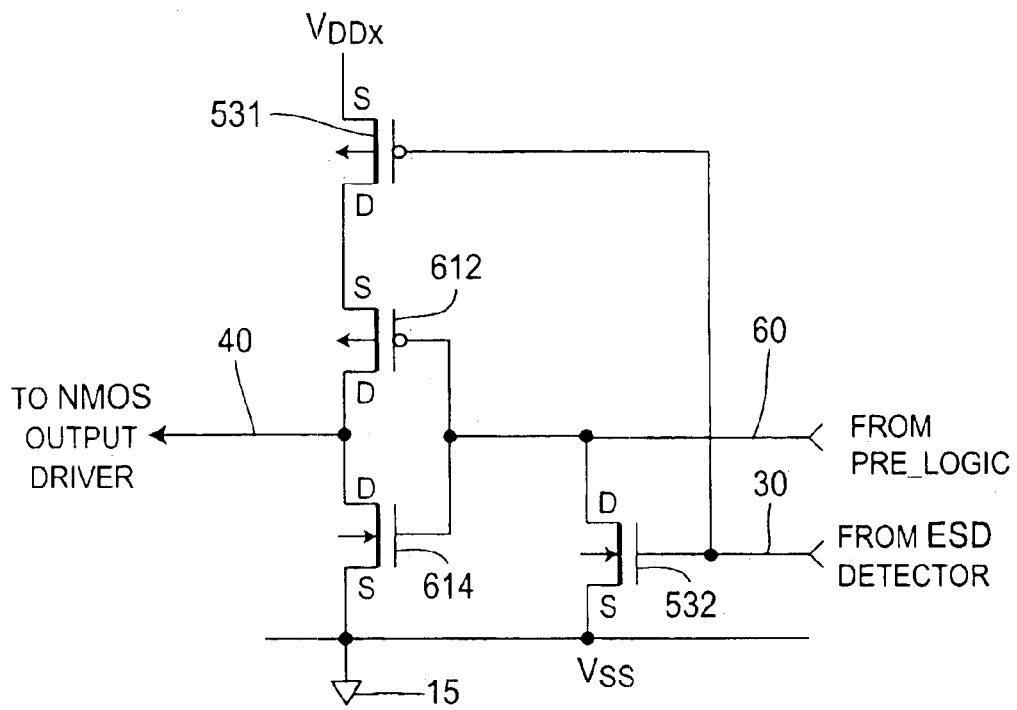

Referring to FIG. 12D, the configuration is the same as shown in FIG.12C, except that the output of the inverter pre-driver 600 is alternately coupled to the gates of the active fingers 153 of the multi-finger NMOS transistor device 100 and that the input 60 of the inverter pre-driver receives a signal from some pre-driver logic. For either embodiment in FIGS. 12C and 12D, during an ESD event, transistor 531 is turned off and transistor 532 is turned on. The inputs of the inverters 601 and 600 are pulled low to ground 15. NMOS transistor 614 is turned off and PMOS transistor 612 is turned on. As such, the entire structure enters into a tri-state high impedance condition at lines 40 or 41, thereby preventing the pre-driver 601 (or 600) from influencing the effects of the transfer circuit 320.

It is further noted that the pre-driver 600 and dummy pre-driver 601 configurations (as shown in FIGS. 12A–12B) depending on their power supply and pre-logic connections may also act as transfer circuits 320. That is, because they also transfer some of the ESD voltage to the gate of the NMOS transistor 100. One difference with respect to the regular ESD transfer circuit 320 of FIGS. 4–10 is that the ESD voltage does not come via the ESD detector 310. Rather, the ESD voltage is provided via the charged VDD line and the pre-driver 600 or dummy pre-driver 601. As such, the pre-driver 600 or dummy pre-driver 601 are supportive to the ESD biasing of the ESD detector 310 and transfer circuit 320. If the existing pre-drivers 600 and 601 configurations cannot be guaranteed to act as the transfer circuit to properly bias the output driver 100, for ESD purposes, the pre-driver control 500 should be added to achieve the desired effect to force the pre-drivers 600 and 601 to provide a bias during ESD. Alternately, a different pre-driver control 500 may be used to prevent the pre-driver from influencing the function of the transfer circuit 320, as discussed above for FIGS. 12C–12D with regard to FIG. 5.

It is also noted that the pre-drivers 600 and dummy pre-drivers 601 are utilized to provide biasing conditions that are symmetrical as possible, as between the active and the dummy transistor parts, for most uniform turn-on of the NMOS transistor 100. Such symmetrical conditions are best achieved if both the pre-driver 600 and dummy pre-driver 601 either provide the supportive bias from the supply line VDDx 91 (FIGS. 12A and 12B), or if they are both turned off during the ESD event (FIGS. 12C and 12D).

Figure 13:
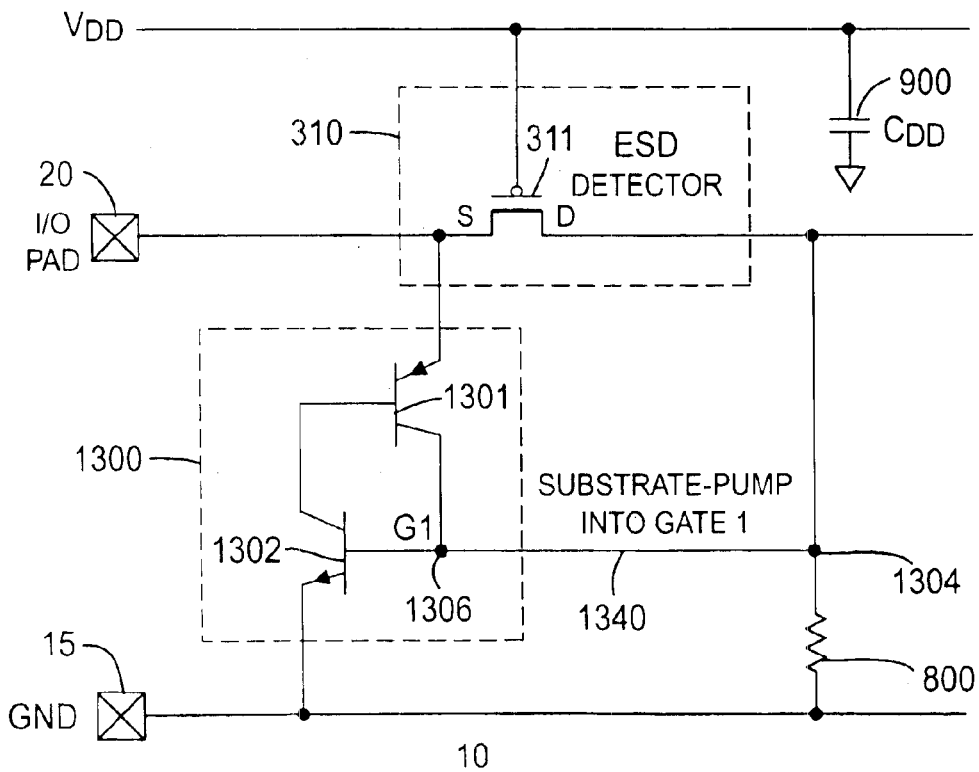
FIG. 13 depicts a schematic diagram of a silicon controlled rectifier (SCR) and PMOS detector of the present invention.

FIG. 13 depicts a schematic diagram of a silicon controlled rectifier (SCR) and PMOS ESD detector 310 of the present invention. The circuit comprises an SCR 1300, an ESD detector 310, a grounding resistor 800, and a parasitic capacitor $C_{DD}$ 900. In particular, the SCR 1300 is utilized to shunt ESD current from the I/O pad 20 to ground 15, rather than the multi-finger NMOS transistor device 100 of FIGS. 1–12. As is well known by persons in the art, an SCR 1300 may be represented by a PNP transistor 1301 and an NPN transistor 1302. The emitter of the PNP transistor 1301 is coupled to the pad 20 and the emitter of the NPN transistor 1302 is coupled to ground. Although only a single SCR 1300 is illustratively, shown, one skilled in the art will understand that the single SCR 1300 may alternately comprise multiple SCR fingers. For a detailed understanding of the manufacture and operation of an SCR ESD protection device, the reader is directed to U.S. patent application Ser. No. 10/007,833, filed Nov. 5, 2001, by common assignee Sarnoff Corporation of Princeton, N.J., which is incorporated by reference herein, in it's entirety.

The configuration of the circuit of FIG. 13 is similar to that described with regard to FIG. 4. In particular, the ESD detector 310 comprises a PMOS transistor 311 having the source coupled to the pad 20 and to the emitter of the PNP transistor 1301 of the SCR 1300. The gate of the PMOS transistor 311 is coupled to the supply line VDD 60, and the drain of the PMOS transistor 311 is coupled to ground 15, via grounding resistor 800. A first gate G1 1306 is coupled to the grounding resistor and drain of the PMOS ESD transistor 311 at node I 304. Specifically, the first gate G1 1306 of each SCR finger is biased via a substrate pump 1340, which is fabricated using a plurality of interspersed local substrate ties (trigger taps) coupled together, as illustratively shown with regard to the NMOS device 100 of FIG. 1, or as specifically described for an SCR in U.S. patent application Ser. No. 10/007,833 mentioned above.

During an ESD event, when the IC 10 is in a non-powered state, the PMOS ESD detector 311 turns on and provides a gate biasing signal to the first gate G1 1306 of the SCR 1300 in a similar manner as described with regard to the NMOS transistor 100 of FIGS. 4. One advantage of using the SCR 1300 is that the SCR may be used in conjunction with the NMOS transistor 100, such that the SCR 1300 replaces the passive dummy ESD fingers 151 of the NMOS transistor 100. The SCR 1300 is a low voltage-clamping device that forms in conjunction with the ESD control circuit 300 also a low voltage triggering device, and is used only for ESD protection.

Although various embodiments that incorporate the teachings of the present invention have been shown and described in detail herein, those skilled in the art can readily devise many other varied embodiments that still incorporate these teachings.

We claim:

1. An ESD protection circuit for a semiconductor integrated circuit (IC) having protected circuitry, comprising:
    a multi-fingered NMOS transistor, each finger having a drain and source respectively coupled between an I/O pad of the IC and ground, and a gate of each finger for biasing said finger;
    an ESD detector having a PMOS transistor comprising a source coupled to said I/O pad of the IC, and a gate coupled to a first supply voltage of the IC;
    a parasitic capacitance formed between the supply line of the IC and ground; and
    a transfer circuit having a first diode, where the cathode and anode are respectively coupled to the drain of the PMOS transistor and the gate of each finger of the NMOS transistor.

2. The ESD protection circuit of claim 1, wherein the gate of each finger of said NMOS transistor is coupled to a pre-driver during normal IC operation.

3. The ESD protection circuit of claim 1, wherein said multi-fingered NMOS transistor further comprises a plurality of active fingers and a plurality of ESD dummy fingers, wherein the gates of the active fingers are coupled to said first diode and a pre-driver.

4. The ESD protection circuit of claim 3, further comprising:
    a first ground resistor coupled between said transfer circuit and ground.

5. The ESD protection circuit of claim 4, wherein said transfer circuit further comprises a second diode, where the cathode and anode of the second diode are respectively coupled to the drain of said PMOS transistor and the first ground resistor, said second diode further coupled to the gates of said ESD dummy fingers.

6. The ESD protection circuit of claim 5, further comprising a second ground resistor, coupled between the drain of said PMOS transistor and ground.

7. The ESD protection circuit of claim 6, further comprising:
   a voltage limiter coupled between said transfer circuit and ground.

8. The ESD protection circuit of claim 7, wherein said voltage limiter comprises:
   a first cascoded NMOS transistor having a source coupled to ground; and
   a second cascoded NMOS transistor having the drain coupled to the gates of the plurality of active fingers, a gate coupled to a node formed between the drain of said PMOS transistor and the second ground resistor, and a source coupled to the drain and gate of the first cascoded NMOS transistor.

9. The ESD protection circuit of claim 6, further comprising a pre-driver control coupled to said pre-driver.

10. The ESD protection circuit of claim 9, wherein said pre-driver control comprises an NMOS transistor having a drain coupled to an input of said pre-driver, the source coupled to ground, and the gate coupled between said transfer circuit and the first ground resistor.

11. The ESD protection circuit of claim 10, wherein said pre-driver control further comprises a pull-up element coupled to a second supply line and the input of said pre-driver, where the second supply line has a voltage potential greater than a voltage potential at said input of said pre-driver.

12. The ESD protection circuit of claim 1, further comprising a PMOS transistor having a source and a N-well tie coupled to said first supply line and a drain coupled to the pad.

13. An ESD protection circuit for a semiconductor integrated circuit (IC) having protected circuitry, comprising:
   a cascoded multi-fingered NMOS transistor, each finger having a first transistor and a second transistor, the drain of the first transistor and the source of the second transistor respectively coupled between an I/O pad of the IC and ground, the source of the first transistor coupled to the drain of the second transistor, and a gate of each transistor of each finger for biasing said finger;
   an ESD detector having a PMOS transistor comprising a source coupled to said I/O pad of the IC, and an N-well tie coupled to the gate of the PMOS transistor;
   a parasitic capacitance formed between the supply line of the IC and ground;
   a transfer circuit comprising
      a first diode having the anode and the cathode respectively coupled to the drain of the PMOS transistor and to the gate of the second transistor of each finger of the NMOS transistor; and
      a second diode having the anode and the cathode respectively coupled to the drain of the PMOS transistor and the gate of the first transistor of each finger of the NMOS transistor; and
   a plurality of serially coupled diodes coupled between a supply line and the gate of the PMOS transistor, where the cathodes and anodes of the serially coupled diodes respectively point towards the supply line and towards the gate of the PMOS transistor.

14. The ESD protection circuit of claim 13, wherein the gate of each second transistor of each finger is coupled to a pre-driver.

15. The ESD protection circuit of claim 13, wherein said cascoded multi-fingered NMOS transistor further comprises a plurality of active fingers and a plurality of ESD dummy fingers, wherein the gates of the second transistor of the active fingers are coupled to said first diode and a pre-driver.

16. The ESD protection circuit of claim 13, further comprising:
   a first ground resistor coupled between said transfer circuit and ground.

17. The ESD protection circuit of claim 16, wherein said transfer circuit comprises a third diode having an anode and cathode respectively coupled to the drain of said PMOS transistor and to the first ground resistor, said third diode having the cathode further coupled to the gates of the second transistors of said ESD dummy fingers.

18. The ESD protection circuit of claim 13, further comprising a second ground resistor, coupled between the drain of said PMOS transistor and ground.

19. The ESD protection circuit of claim 13, wherein said second diode is coupled to the gates of the first transistors of said active and ESD dummy fingers, said gates of the first transistors of said active and ESD dummy fingers further coupled to the supply line via a third resistor.

20. The ESD protection circuit of claim 19, further comprising:
   a voltage limiter coupled between said transfer circuit and ground.

21. The ESD protection circuit of claim 20, wherein said voltage limiter comprises:
   a first NMOS transistor having a source coupled to ground; and
   a second NMOS transistor having the drain coupled to the gates of the second transistors of the plurality of said active and dummy fingers, a gate coupled to a node formed between the drain of said PMOS transistor and the second ground resistor, and a source coupled to the drain and gate of the first NMOS transistor;
   a third NMOS transistor having the drain coupled to the gates of the first transistors of the plurality of active fingers, a gate coupled to the node, and a source coupled to the drain and gate of the first NMOS transistor;
   a fourth NMOS transistor having the drain coupled to the gates of the second transistors of the plurality of ESD dummy fingers, a gate coupled to a node, and a source coupled to the drain and gate of the first NMOS transistor.

22. The ESD protection circuit of claim 20, further comprising a pre-driver control coupled to said pre-driver.

23. The ESD protection circuit of claim 22, wherein said pre-driver control comprises an NMOS transistor having a drain coupled to an input of said pre-driver, the source coupled to ground, and the gate coupled between said transfer circuit and the first ground resistor.

24. The ESD protection circuit of claim 13, further comprising a voltage-limiting resistor coupled between the gate and the N-well tie of the PMOS transistor, wherein said voltage-limiting resistor is further coupled to a well pump of said IC.

25. The ESD protection circuit of claim 13, further comprising an N-well pull-down loop, said N-well pull-down loop comprising:
   a first NMOS transistor having a source coupled to ground and a gate coupled to the drain of the PMOS transistor and the second ground resistor; and
   a second NMOS transistor having a source coupled to the drain of the first NMOS transistor, and a drain and a gate coupled to the N-well tie of the PMOS transistor.

26. The ESD protection circuit of claim 25, further comprising a breakdown device coupled to the N-well tie of said PMOS transistor and ground.

27. An ESD protection circuit for a semiconductor integrated circuit (IC) having protected circuitry, comprising:
   a cascoded multi-fingered NMOS transistor, each finger having a first transistor and a second transistor, the drain of the first transistor and the source of the second transistor respectively coupled between an I/O pad of the IC and ground, the source of the first transistor connected to the drain of the second transistor, and a gate of each transistor of each finger for biasing said finger;
   a PMOS transistor, having a source coupled to said I/O pad of the IC, and a gate coupled to an N-well tie;
   a diode chain comprising a plurality of serially coupled diodes coupled between the supply line and the gate of the PMOS transistor, where the cathodes and anodes of the serially coupled diodes respectively point towards the supply line and towards the gate of the PMOS transistor;
   a parasitic capacitance formed between the supply line of the IC and ground; and
   at least one local substrate tie formed in proximity to the multi-finger NMOS transistor and coupled to the drain of the PMOS transistor.

28. The ESD protection circuit of claim 27, wherein said multi-fingered NMOS transistor further comprises a plurality of active fingers and a plurality of ESD dummy fingers, and a first resistor coupled to the drain of said PMOS transistor and ground, said at least one local substrate tie further coupled to the drain of said PMOS transistor and said first resistor.

29. The ESD protection circuit of claim 28, wherein the gates of the second cascoded transistor of the active fingers are coupled to a pre-driver, and the gates of the second cascoded transistor of said ESD dummy fingers are coupled to any one element comprising ground and at least one local substrate tie, and the gates of the first cascoded transistors of the active and ESD dummy fingers are coupled via a pull-up resistor to the supply voltage and further coupled via a first diode, wherein the cathode is coupled to said gates and the anode is coupled to the drain of said PMOS transistor and said first resistor.

30. An ESD protection circuit for a semiconductor integrated circuit (IC) having protected circuitry, comprising:
   an SCR having at least one finger, each finger having a PNP transistor and an NPN transistor, where an emitter of the PNP and NPN transistors is respectively coupled between an I/O pad of the IC and ground, a base of the PNP transistor being coupled to a collector of the NPN transistor, and a base of the NPN transistor being coupled to a collector of the PNP transistor, and said NPN transistor of each finger further comprising a first gate for triggering said finger; and
   a PMOS transistor, having a source and a drain respectively coupled to said I/O pad of the IC and the first gate of the NPN transistor, and a gate coupled to a supply voltage of the IC.

31. The ESD protection circuit of claim 30 further comprising:
   a parasitic capacitance formed between the supply line of the IC and ground.

32. The ESD protection circuit of claim 30 further comprising:
   a grounding resistor coupled between the first gate and ground.

33. The ESD protection circuit of claim 30 further comprising:
   a parasitic capacitance formed between the supply line of the IC and ground, and
   a grounding resistor coupled between the first gate and ground.

34. An ESD protection circuit for a semiconductor integrated circuit (IC) having protected circuitry, comprising:
   a cascoded multi-fingered NMOS transistor, each finger having a first transistor and a second transistor, the drain of the first transistor and the source of the second transistor respectively coupled between an I/O pad of the IC and ground, the source of the first transistor coupled to the drain of the second transistor, and a gate of each transistor of each finger for biasing said finger;
   an ESD detector having a PMOS transistor comprising a source coupled to said I/O pad of the IC, and a gate coupled to an N-well tie;
   a transfer circuit comprising
      a first diode having the anode and the cathode respectively coupled to the drain of the PMOS transistor and to the gate of the second transistor of each finger of the NMOS transistor; and
      a second diode having the anode and the cathode respectively coupled to the drain of the PMOS transistor and the gate of the first transistor of each finger of the NMOS transistor; and
   a breakdown device coupled to the N-well tie of said PMOS transistor, and ground.

35. The ESD protection circuit of claim 34, wherein the breakdown device consists of an element selected from a Zener diode, a regular junction diode, and a grounded gate NMOS device.

* * * * *